US007060374B2

(12) United States Patent
Kobayashi et al.

(10) Patent No.: US 7,060,374 B2
(45) Date of Patent: Jun. 13, 2006

(54) GRANULAR MAGNETIC THIN FILM AND METHOD FOR MAKING THE SAME, MULTILAYERED MAGNETIC FILM, MAGNETIC COMPONENTS AND ELECTRONIC EQUIPMENT

(75) Inventors: Kazuyoshi Kobayashi, Gunma (JP); Kenji Ikeda, Gunma (JP); Masayuki Fujimoto, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 10/842,449

(22) Filed: May 11, 2004

(65) Prior Publication Data

US 2004/0209098 A1    Oct. 21, 2004

Related U.S. Application Data

(62) Division of application No. 10/221,869, filed as application No. PCT/JP02/00278 on Jan. 17, 2002.

(30) Foreign Application Priority Data

Jan. 18, 2001   (JP)   ............................. 2001-10839
May 16, 2001   (JP)   ............................. 2001-145891

(51) Int. Cl.
  G11B 5/66   (2006.01)
  G11B 5/70   (2006.01)
(52) U.S. Cl. .................................................. 428/828
(58) Field of Classification Search ................ 428/828, 428/828.1, 811.2, 811.3, 811.5, 815, 694 TM, 428/336, 900, 668
See application file for complete search history.

(56) References Cited

U.S. PATENT DOCUMENTS 6,630,255 B1   10/2003   Litvinov et al. ..... 428/694 TM

FOREIGN PATENT DOCUMENTS

| JP | 9-50618 | 2/1997 |
| JP | 9-82522 | 3/1997 |
| JP | 10-270246 | 10/1998 |
| JP | 2000-150233 | 5/2000 |
| JP | 2000-340425 | 12/2000 |

OTHER PUBLICATIONS

Merriam Webster's Collegiate Dictionary, Tenth Edition, p. 607.*

* cited by examiner

*Primary Examiner*—Holly Rickman
(74) *Attorney, Agent, or Firm*—McDermott Will & Emery LLP

(57) ABSTRACT

There are provided a magnetic thin film utilizing a granular film and having excellent high frequency characteristics and a method of manufacturing the same, and a multilayered magnetic film and magnetic components and electronic equipment utilizing the same.

A nonreactive sputtering is performed so that there is no oxidation of a magnetic metal, and a saturation magnetization is increased to increase a resonant frequency of permeability. Also, a multi-target simultaneous sputtering is combined with the nonreactive sputtering so that in a granular structure including magnetic grains and an insulating layer a size of the magnetic grains and a thickness of the insulating layer are optimized thereby ensuring a proper magnitude for a crystalline magnetic anisotropy within the grains and excellent soft magnetic properties. Further, the optimization of the thickness of the insulating layer has the effect of improving a resistivity, decreasing an eddy current and improving an exchange interaction between the magnetic grains.

16 Claims, 22 Drawing Sheets

(A)

10.00nm (A)

(B)

(A)

(B)

(A)

(B)

(A)

(B)

(A)

(B)

(A)

(B)

GRANULAR MAGNETIC THIN FILM AND METHOD FOR MAKING THE SAME, MULTILAYERED MAGNETIC FILM, MAGNETIC COMPONENTS AND ELECTRONIC EQUIPMENT

This application is a divisional of application Ser. No. 10/221,869 filed Sep. 17, 2002 which is a 371 PCT/JP02/00278, filed Jan. 17, 2002.

TECHNICAL FIELD

The present invention relates to a granular magnetic thin film in which magnetic grains are scattered in an insulating material and a method of making the same, a multilayered magnetic film, magnetic components and electronic equipment and more particularly to improvements in and relating to the magnetic properties in high frequency bands.

BACKGROUND ART

There has been a demand for improvement in the operating frequency of electronic components paralleling the trend towards increasing the speed and capacity (greater frequency bands) in the field of mobile communication represented, for example, by the mobile telephone system. This also holds good with magnetic devices such as inductor transformers and their use in high frequency bands is now studied. Typical of such materials as expected for use in such high frequency bands is a nano-granular magnetic thin film of the type in which the grains of a magnetic material are included in an insulating material. The nano-granular magnetic thin film has a structure in which the magnetic grains of the order of a nano-scale (nm, $10^{-9}$ m) are enclosed by the grain boundaries of the insulating material. This is subjected to a wide study as a magnetic material for use in high frequency bands because of the expected reduction in crystalline magnetic anisotropy due to the improved fineness of magnetic grains as well as the improved electric specific resistance due to the grain boundaries of the insulating material.

For instance, Japanese Laid-Open Patent Publication No. 9-82522 proposes a magnetic film designed to obtain an uniaxial magnetic anisotropy of a proper magnitude and a permeability having excellent high frequency characteristics including a high electric resistance and a high degree of saturation magnetization. Also, Japanese Laid-Open Patent Publication No. 10-270246 proposes a magnetic film designed to obtain excellent soft magnetic properties in high frequency bands including an anisotropic magnetic field of over 20 oersted (Oe), an electric specific resistance value of 50 μΩcm or over and a saturation magnetic flux density of 16 kG or over. These nano-granular magnetic thin films employing CoFe alloy attract a notice in that they have a structure in which the magnetic grains of CoFe alloy crystals are enclosed by the grain boundaries of the insulating material composed of a ceramic and both a high saturation magnetization and a high electric specific resistance coexist with each other.

With such magnetic material used in high frequency bands, however, it is required to increase the resonant frequency of the permeability which limits its operating band. In order to increase the resonant frequency of permeability, it is required to have high saturation magnetization (hence high permeability) and electric specific resistance as well as an anisotropic magnetic field of a proper magnitude.

In the case of the foregoing conventional nano-granular films using CoFe alloy, however, a magnetic film is produced by reactive sputtering for effecting the film formation in an oxygen atmosphere. As a result, the metal in the magnetic grains and the metal forming the insulating material are oxidized. When the magnetic metal is oxidized, the saturation magnetization is decreased to lower the resonant frequency and eventually the operating band is decreased. In addition, no consideration is given to the fact that any excessive growth of the magnetic grains increases the crystalline magnetic anisotropy within the grains thus deteriorating the soft magnetic properties and that any excessively thin thickness of the insulating material deteriorates the resistivity and thus the eddy current loss is increased.

Further, while the previously mentioned nano-granular films are relatively high in resistivity than metallic magnetic films due to the structure in which the magnetic grains are enclosed by the insulating material, it cannot be said that they are sufficiently high in resistivity as compared with oxide magnetic material such as ferrite. Thus, in order to increase the resistivity of a magnetic film, it has been proposed to increase the ratio of an insulating material to the whole film or to use a multilayer film produced by alternately laminating magnetic layers composed of nano-granular films and insulating layers formed by metal oxide or the like. Then, while increasing the proportion of the insulating material in the nano-granular film as mentioned above has the effect of increasing the whole resistivity due to the increased thickness of the insulating material which separates the magnetic grains from each other, conversely the exchange interaction between the magnetic grains is deteriorated and the coercive force is increased due to an increase in the average distance between the adjacent magnetic grains. Also, the proportion of the magnetic grains is relatively decreased and thus the saturation magnetization is inevitably decreased. In the case of the magnetic film used at a high frequency, the saturation magnetization and the anisotropic magnetic field are both important physical quantities which determine the resonant frequency and therefore any attempt to attain an increased resistance by such method has a large possibility of deteriorating the high frequency characteristics.

Further, the above-mentioned multilayered magnetic film is such that while the resistivity is increased by the introduction of the insulating layers, capacitors are formed within the magnetic film because of its multilayered structure thus causing a loss due to a displacement current. In addition, the thickness of the insulating layers is relatively large ranging from 100 nm to several μm so that there is a disadvantage of decreasing the magnetic coupling between the magnetic grains holding the insulating layers therebetween thus eventually failing to ensure adequate magnetic properties.

The present invention has stemmed from the noticing of the foregoing deficiencies, and it is an object of the present invention to provide a magnetic thin film utilizing a granular film and having excellent high frequency characteristics, a method of producing the same, and a multilayered magnetic film and magnetic components and electronic equipment utilizing the same.

DISCLOSURE OF INVENTION

With a view to accomplishing the above object, the present invention consists in a granular magnetic thin film in which an insulating material is present around grain boundaries so as to enclose magnetic grains and which is characterized in the following:

(1) that the resonant frequency of permeability is 2 GHz or over, (2) that the thickness of the insulating material (the spacing between the magnetic grains) is between 0.5 nm and 1.5 nm, or (3) that the spectral peak of an oxide of a magnetic metal cannot be observed by a measurement of an X-ray photoelectron spectroscopy. The production method of the granular magnetic thin film according to the present invention is characterized by the steps of preparing a magnetic metal target and an insulating material target, respectively, and sputtering the targets simultaneously in a nonoxidizing atmosphere, thereby forming on a substrate a thin film in which the insulating material is present around grain boundaries so as to enclose magnetic grains.

A nano-granular magnetic thin film of the present invention is characterized in that the film is formed by utilizing the following:

(1) multi-target simultaneous sputtering of separately but simultaneously sputtering a magnetic metal target (e.g., Co, Fe, Ni or the like) and an oxide ceramic target (e.g., $Al_2O_3$, MgO or the like), or (2) nonreactive sputtering for effecting the film formation without feeding oxygen into an atmosphere.

Firstly, there is no oxidation of the magnetic metal owing to the use of the nonreactive sputtering. As a result, the saturation magnetization is increased and hence the resonant frequency is increased thus making it possible to use the film in high frequency bands. In addition, since there is no need to introduce oxygen during the film formation, the number of parameters for the film forming conditions is decreased and eventually the film formation is made easy. Then, by combining the multi-target simultaneous sputtering and the nonreactive sputtering, it is possible to control and optimize the size of magnetic grains and the thickness of an insulating material (the spacing between magnetic grains) in a nano-structure (granular structure) composed of magnetic grains and an insulating material, thereby eventually obtaining improved high frequency characteristics. Considering the mechanism for the development of soft magnetic properties of the nano-granular magnetic thin film, it is desirable that the size of the magnetic grains is less than 10 nm (100 Å). By effecting the optimization of the size of the magnetic grains in this way, the crystalline magnetic anisotropy within the grains has a suitable magnitude and thus excellent soft magnetic properties can be obtained. Also, the thickness of the insulating material or the spacing between the magnetic grains should preferably be between 0.5 nm (5 Å) and 1.5 nm (15 Å). By optimizing the thickness of the insulating material in this manner, the resistivity is improved to decrease the eddy current and further the exchange interaction between the magnetic grains is made excellent.

The multilayered magnetic film of the present invention is a multilayered magnetic film made by alternately laminating magnetic layers each composed of a granular film including magnetic grains enclosed by an insulating material and insulating layers and it is characterized in that the thicknesses of the magnetic layers and the insulating layers are predetermined such that the growth of the magnetic grains is prevented by the insulating layers.

One primary form of the present invention features that the magnetic layer is composed of a CoFeAlO film and the insulating layer is composed of an $Al_2O_3$ film. More specifically, it features that if WM represents the thickness of the magnetic layer and WI represents the thickness of the insulating layer, any one of the following relations is satisfied, $5\text{ Å}<WM\leq130\text{ Å}, WI\leq10\text{ Å}$, ①

$10\text{ Å}\leq WM\leq100\text{ Å}, WI\leq10\text{ Å}$, ②

$5\text{ Å}<WM\leq130\text{ Å}, 5\text{ Å}\leq WI\leq8\text{ Å}$, ③

$10\text{ Å}\leq WM\leq100\text{ Å}, 5\text{ Å}\leq WI\leq8\text{ Å}$, ④

Another form features that the magnetic layer is composed of a CoFeSiO film and the insulating layer is composed of an $SiO_2$ film. More specifically, if WM represents the thickness of the magnetic layer and WI represents the thickness of the insulating layer, the following relations are satisfied, $40\text{ Å}\leq WM\leq90\text{ Å}, 5\text{ Å}\leq WI\leq25\text{ Å}$, ①

$40\text{ Å}\leq WM\leq90\text{ Å}, 7\text{ Å}\leq WI\leq25\text{ Å}$, ②

$40\text{ Å}\leq WM\leq90\text{ Å}, 7\text{ Å}\leq WI\leq20\text{ Å}$, ③

$50\text{ Å}\leq WM\leq75\text{ Å}, 5\text{ Å}\leq WI\leq25\text{ Å}$, ④

$50\text{ Å}\leq WM\leq75\text{ Å}, 7\text{ Å}\leq WI\leq25\text{ Å}$, ⑤

$50\text{ Å}\leq WM\leq75\text{ Å}, 7\text{ Å}\leq WI\leq20\text{ Å}$, ⑥

The magnetic components of the present invention each has a feature of employing the foregoing granular thin film(s) or multilayered magnetic film(s) as its magnetic material. One of their primary forms features that it is formed with oxidation preventive films for preventing oxidation of the magnetic metal in the granular magnetic film or multilayered magnetic film. The electronic equipment of the present invention have a feature of employing such magnetic component(s). The above and other objects, features and advantages of the present invention will become apparent from the following detailed description and the accompanying drawings.

BEST MODE FOR CARRYING OUT THE INVENTION

While a large number of embodiments of the present invention are possible, a suitable number of embodiments will be shown and described in detail.

Embodiment 1

The present embodiment is an embodiment of a nano-granular magnetic thin film and its production method. A description will be first made of a case in which a CoFeAlO nano-granular film is formed by means of a dual-target simultaneous nonreactive sputtering using a CoFe alloy target and an $Al_2O_3$ target. The production conditions of the samples produced are as follows. Differing from the conventional film forming methods, the method of this embodiment features that no oxygen is supplied during the film formation. Also, a rare gas such as argon is used as a sputtering gas.

Figure 1:
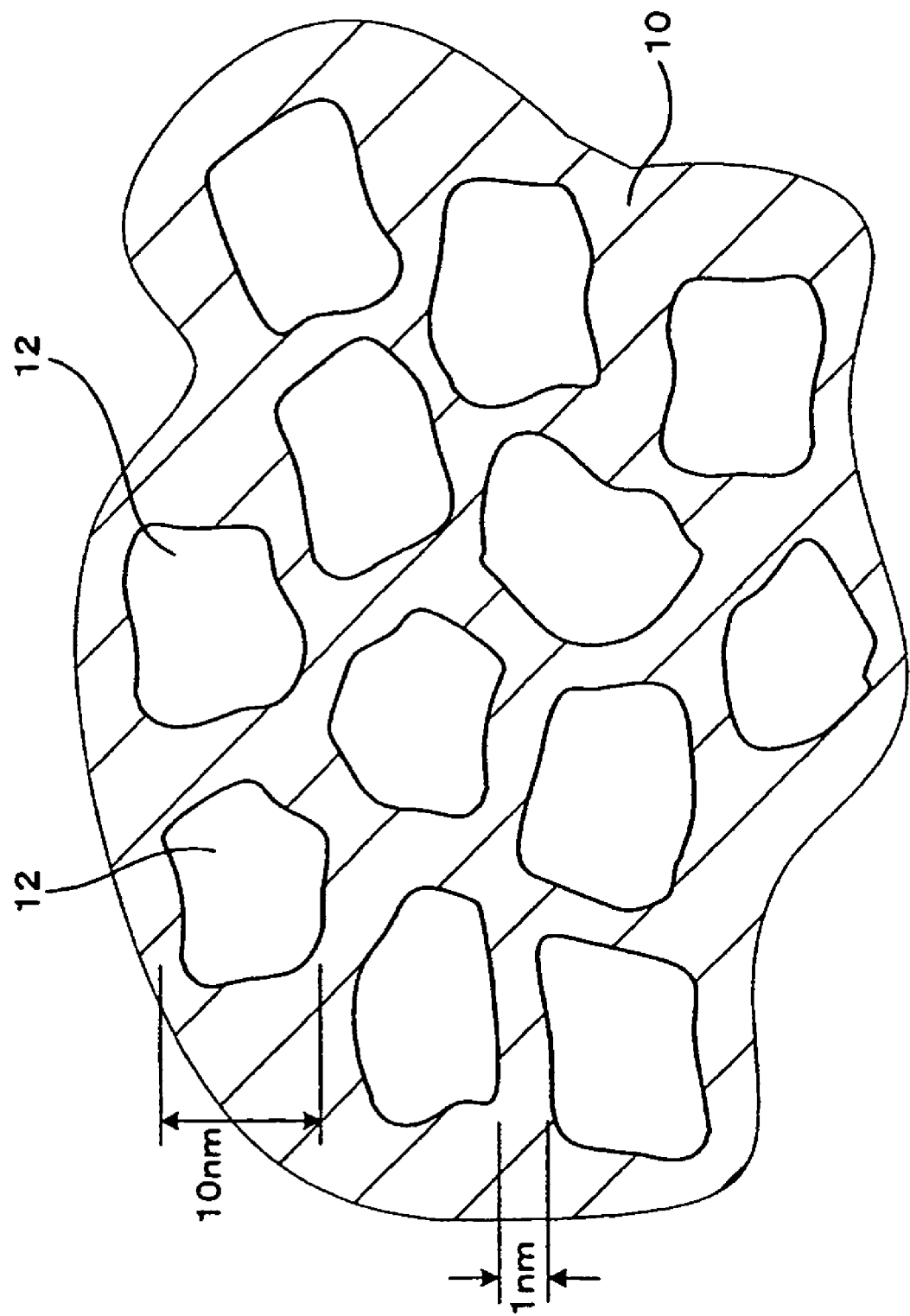
FIG. 1 is a diagram showing the construction of a nano-granular magnetic thin film according to Embodiment 1 of the present invention.

Sputtering gas pressure: 0.42 Pa
Substrate temperature: 20° C.
Substrate: Si single crystal substrate
Film thickness: 0.5 μm FIG. 1 shows the construction of the sample magnetic thin film produced and magnetic grains 12 composed of CoFe alloy are scattered in an insulating material 10 composed of $Al_2O_3$. In other words, it is constructed so that the insulating material 10 is present around the grain boundaries so as to enclose the magnetic grains 12.

Figure 2:
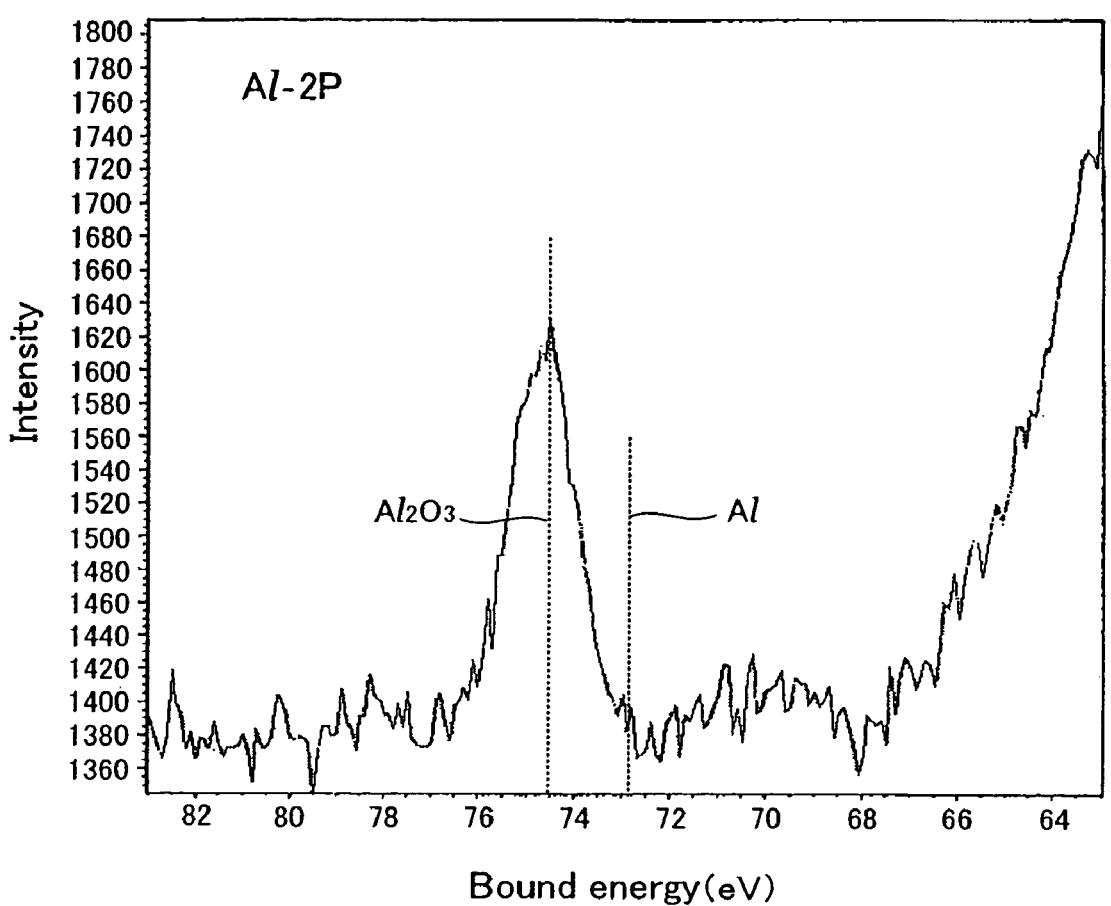
FIG. 2 illustrates graphs showing exemplary measurements of the metal grain spectral of the magnetic thin film according to the above-mentioned embodiment by an X-ray photoelectron spectroscopy.
Figure 2:
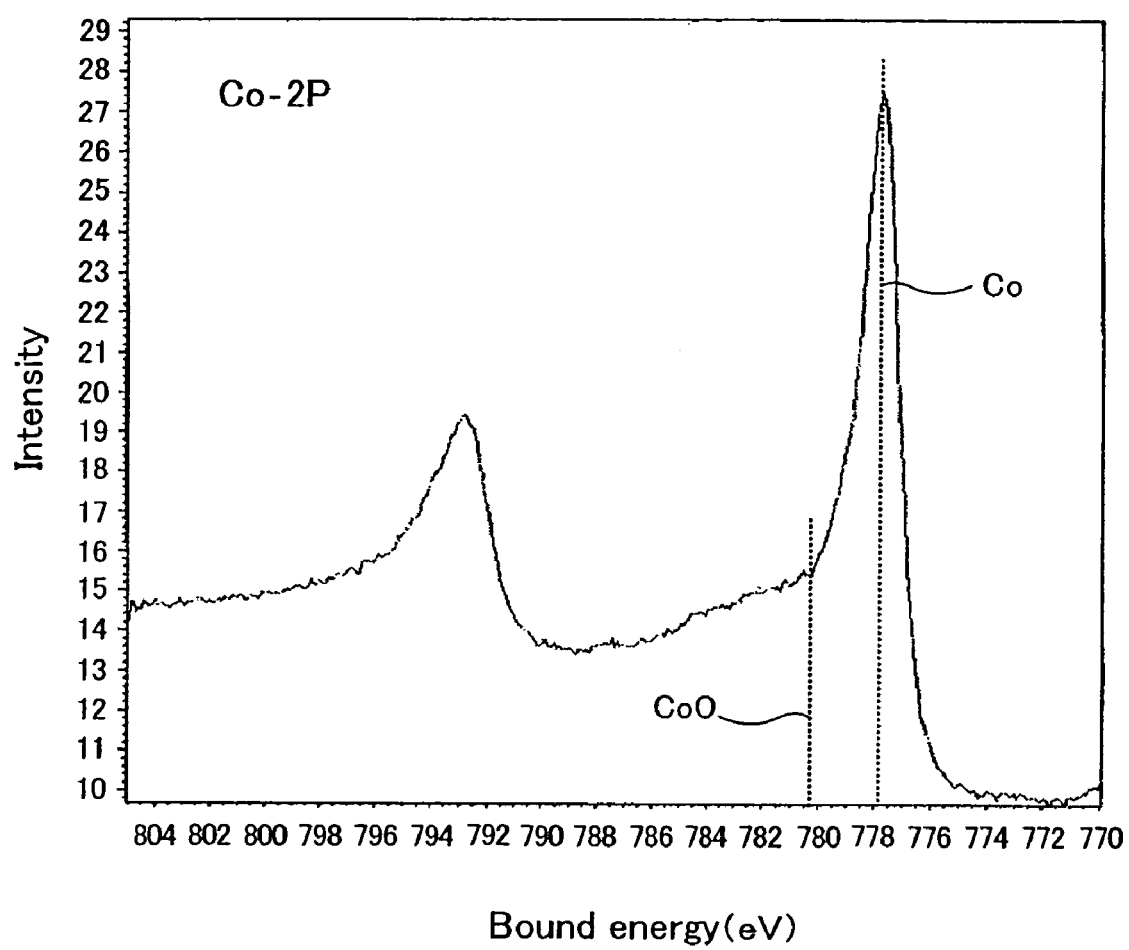
Figure 2:
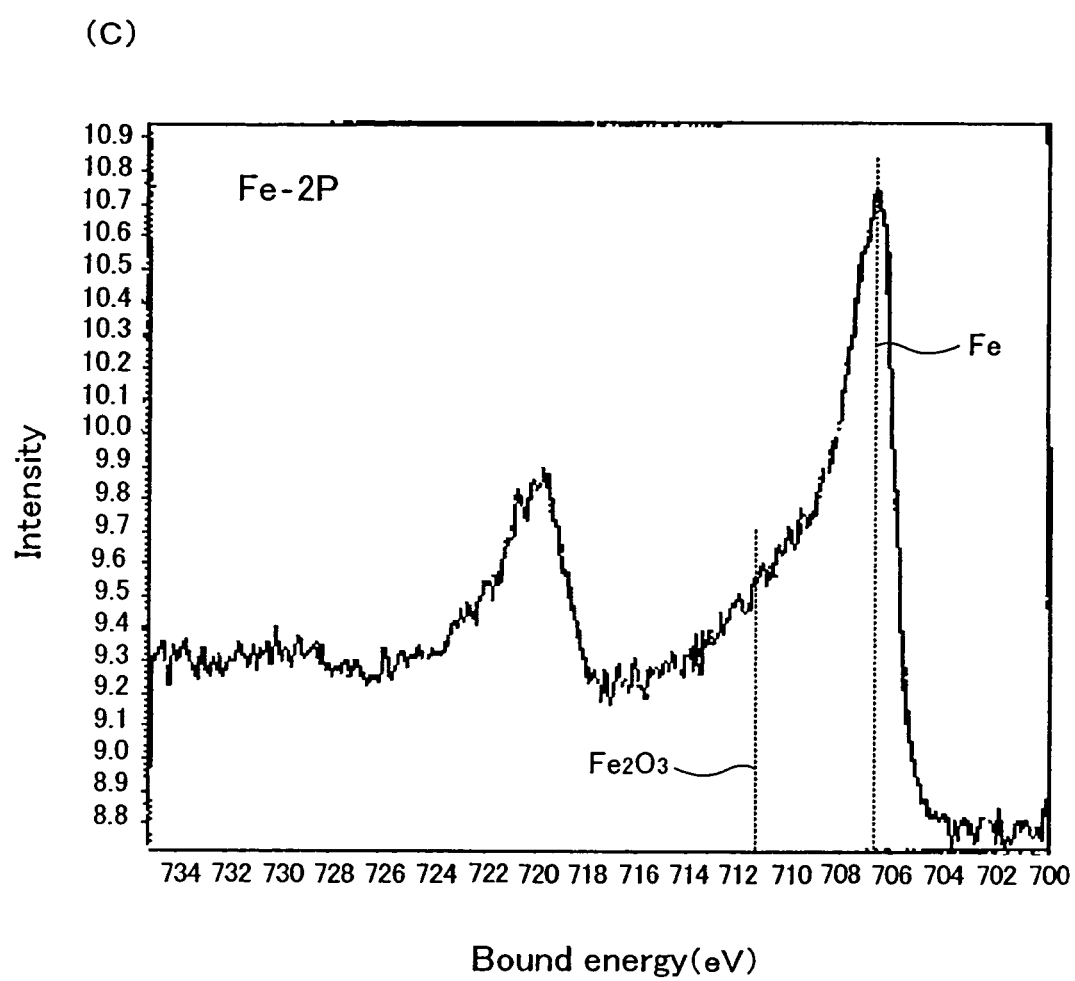

FIG. 2 shows the measurement results of the samples produced according to the XPS (X-ray photoelectron spectroscopy). In each of the graphs, the abscissa represents the bound energy and the ordinate represents the intensity. The XPS measurement is conducted by using MgK α-rays and the sample is irradiated with X-rays generated at an applied current of 5 mA and an applied voltage of 12 kV. Firstly, FIG. 2(A) shows the measurement of 2 p orbital electrons of Al. As shown in the Figure, only the peak of $Al_2O_3$ or an oxide is measured and it is possible to presume that $Al_2O_3$ in the sample acts effectively as an insulating material. FIG. 2(B) shows the measurement made with respect to 2 p orbital electrons of Co and FIG. 2(C) shows the measurement of 2 p orbital electrons of Fe. As shown in these Figures, only the peaks of the metals are observed with respect to Co and Fe and no peaks of their oxides are observed, thus showing the ideal formation of the film.

Figure 17:
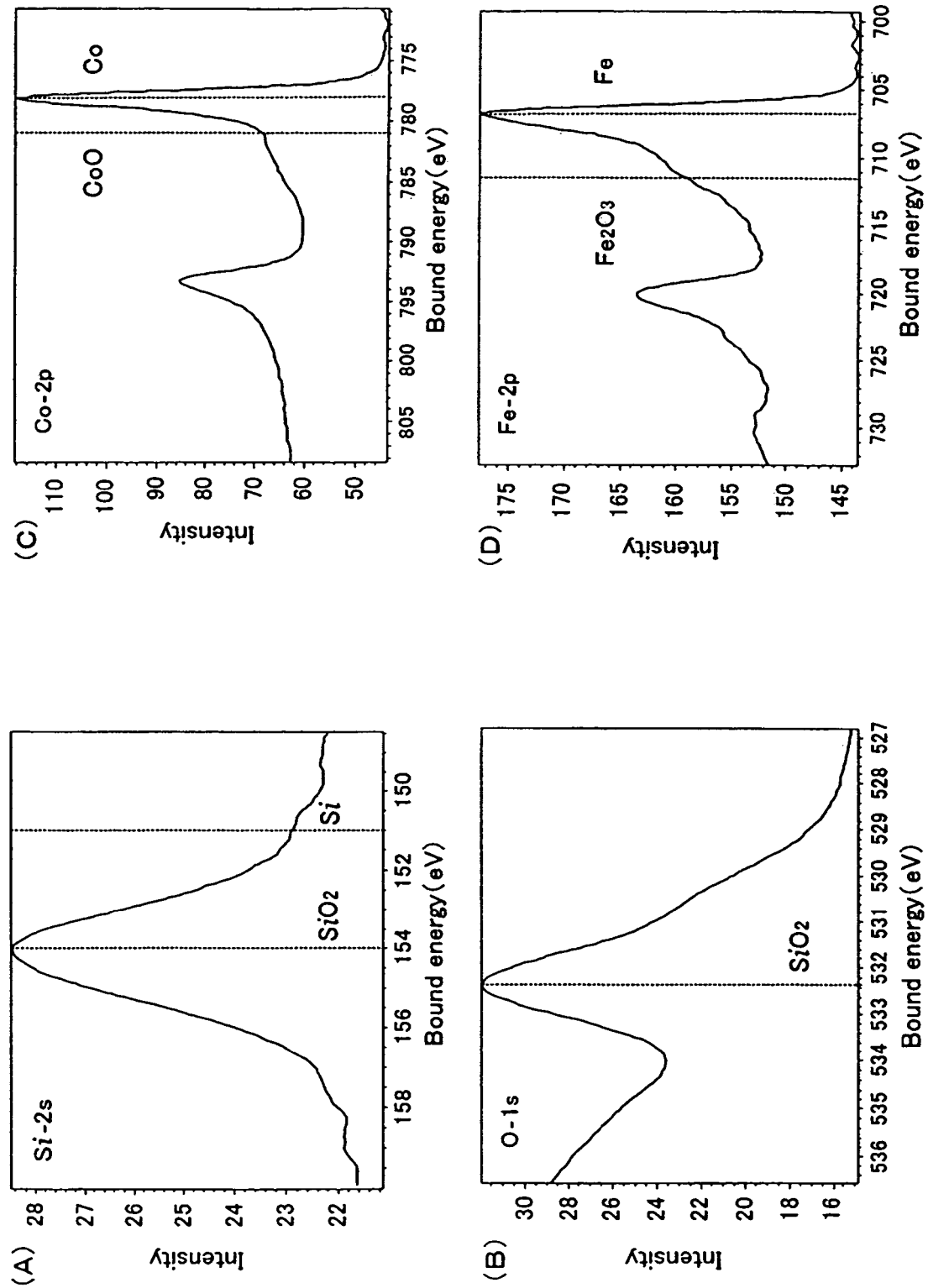
FIG. 17 illustrates graphs showing other exemplary measurements of the metal grain spectral in the magnetic thin film of Embodiment 1 by the X-ray photoelectron spectroscopy.

FIG. 17 shows the measurement results by the XPS of magnetic thin film samples produced, as other examples, by the dual-target simultaneous nonreactive sputtering using a CoFe alloy target and an $SiO_2$ target. In each of the graphs, the abscissa represents the bound energy and the ordinate represents the intensity. It is to be noted that the manufacturing conditions of the samples are the same as in the case of the previously mentioned CoFeAlO nano-granular film and no oxygen is supplied during film formation. Also, the XPS measuring conditions are the same.

FIG. 17(A) shows the measurement result of 2 s orbital electrons of Si. As shown in the Figure, only the peak of $SiO_2$ is observed and no peak of Si is observed. Thus, Si is present in the state of $SiO_2$ and it is presumed that it effectively functions as an insulating material. While, usually, the 2 p orbit is used for the analysis of Si, in the present case the 2 p orbit overlaps with the 3 s orbit of Co and therefore the 2 s orbit is employed. Also, only the peak of $SiO_2$ is observed in the result of the 1 s orbit of O (oxygen) shown in FIG. 17(B), showing that Si is present in the form of $SiO_2$. FIG. 17(C) shows the result of the measurement of 2 p orbital electrons of Co (cobalt), and FIG. 17(D) shows the measurement result of 2 p orbital electrons of Fe (iron). As shown in these Figures, with both Co and Fe, only the peaks of the metals are observed and no peaks of their oxides are observed. Thus, it will be seen that the ideal film formation is effected even in the case of using the CoFe alloy target and $SiO_2$ target.

Figure 3:
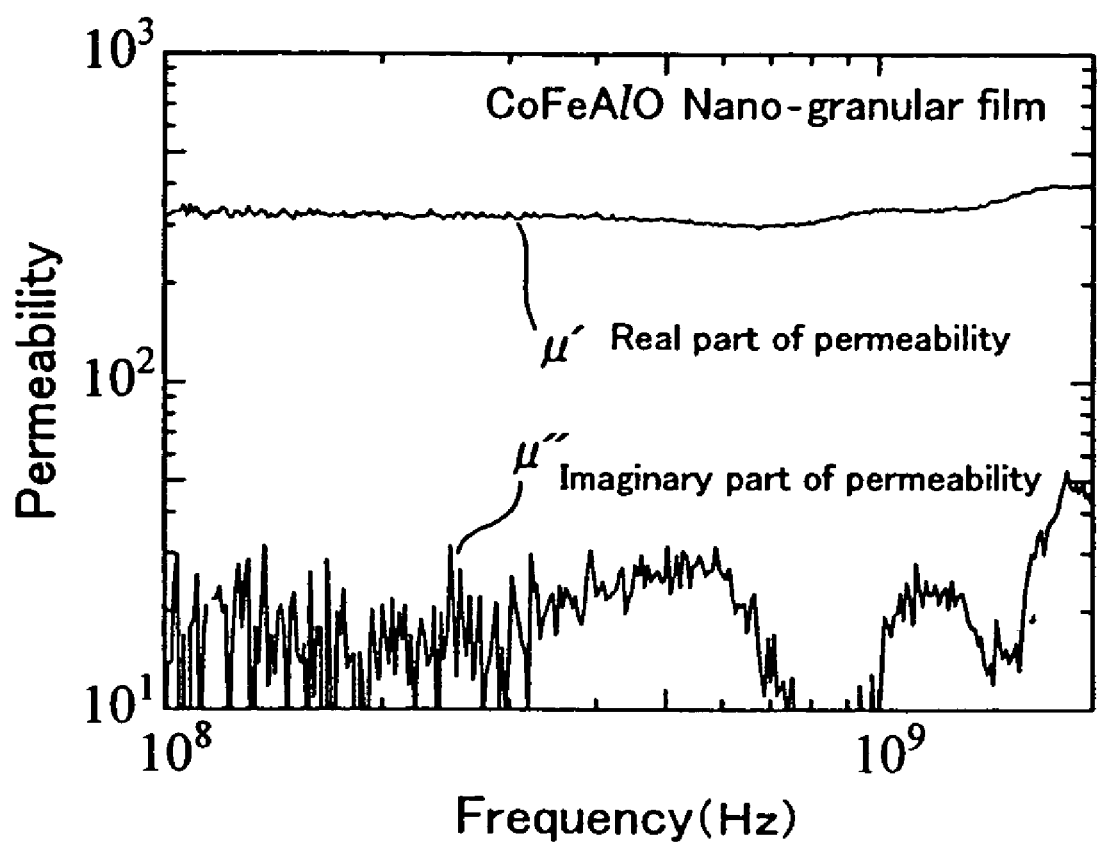
FIG. 3 is a graph showing an exemplary measurement by a single turn coil method of the frequency characteristics of the permeability in the magnetic thin film of the above-mentioned embodiment.

FIG. 3 shows the measurement results of the frequency characteristics of the permeability measured by the single-turn coil method made on the samples of CoFeAlO nano-granular film among the samples manufactured in the forgoing manner. In the Figure, the abscissa represents the frequency and the ordinate represents the permeability. Note that the both axes use the logarithmic scale. As shown in the Figure, the value of the real part μ' of the permeability is on the order of 300 and it increases more or less with increase in the frequency, showing that a sufficiently large value is ensured for each of the measured frequencies. On the other hand, the imaginary part μ" of the permeability shows a value of less than 50 until the frequency reaches 2 GHz and thus it will be seen that in the present embodiment the resonant frequency of the magnetic thin film is over 2 GHz.

Figure 4:
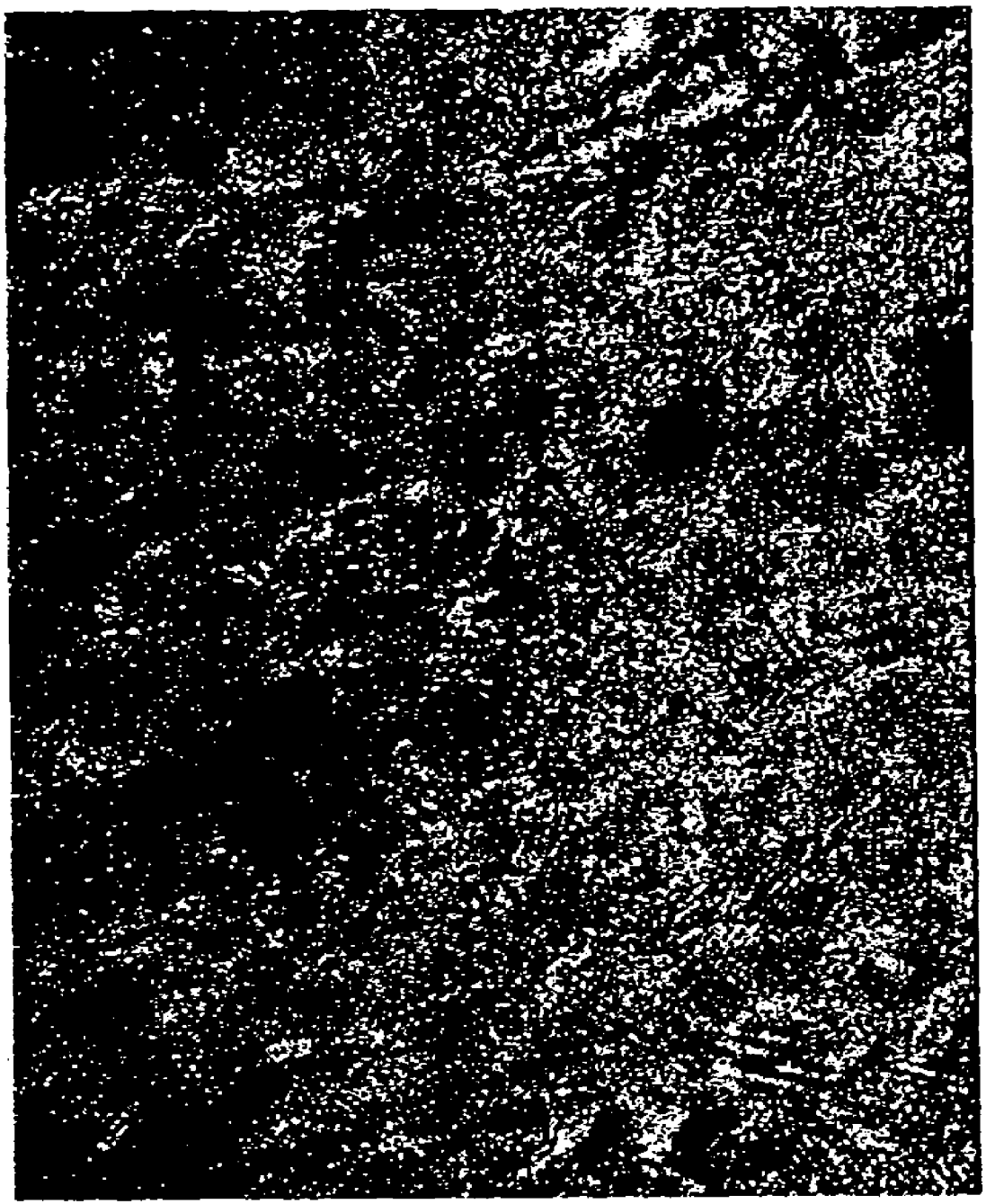
FIG. 4 is a photograph showing an exemplary TEM observation image of the magnetic thin film according to the above embodiment.

FIG. 4 shows an observation image of the manufactured sample by the TEM (transmission electron microscopy). From reference to the Figure it will be seen that the sample has a structure in which crystalline phases (magnetic grains) composed of CoFe and having a grain size of about 10 nm (100 Å) are enclosed by an amorphous layer (insulating layer) composed of $Al_2O_3$ and having a thickness of about 1 nm (10 Å). In this case, if the thickness of the insulating material (corresponding to the spacing or distance between the magnetic grains 12) becomes less than 0.5 nm (5 Å), the electric specific resistance is decreased and the eddy current loss is increased, eventually making the sample unsuitable for practical applications. On the other hand, when the thickness of the insulating material 10 becomes greater than 1.5 nm (15 Å), the exchange interaction between the magnetic grains 12 decreases and thus the soft magnetic properties are deteriorated. As a result, the thickness of the insulating material 10 should preferably be in the range from 0.5 nm to 1.5 nm. Particularly, the thickness of the insulating material 10 should preferably be between 0.8 nm and 1.2 nm from the standpoint of optimization of the permeability.

Embodiment 2

Figure 5:
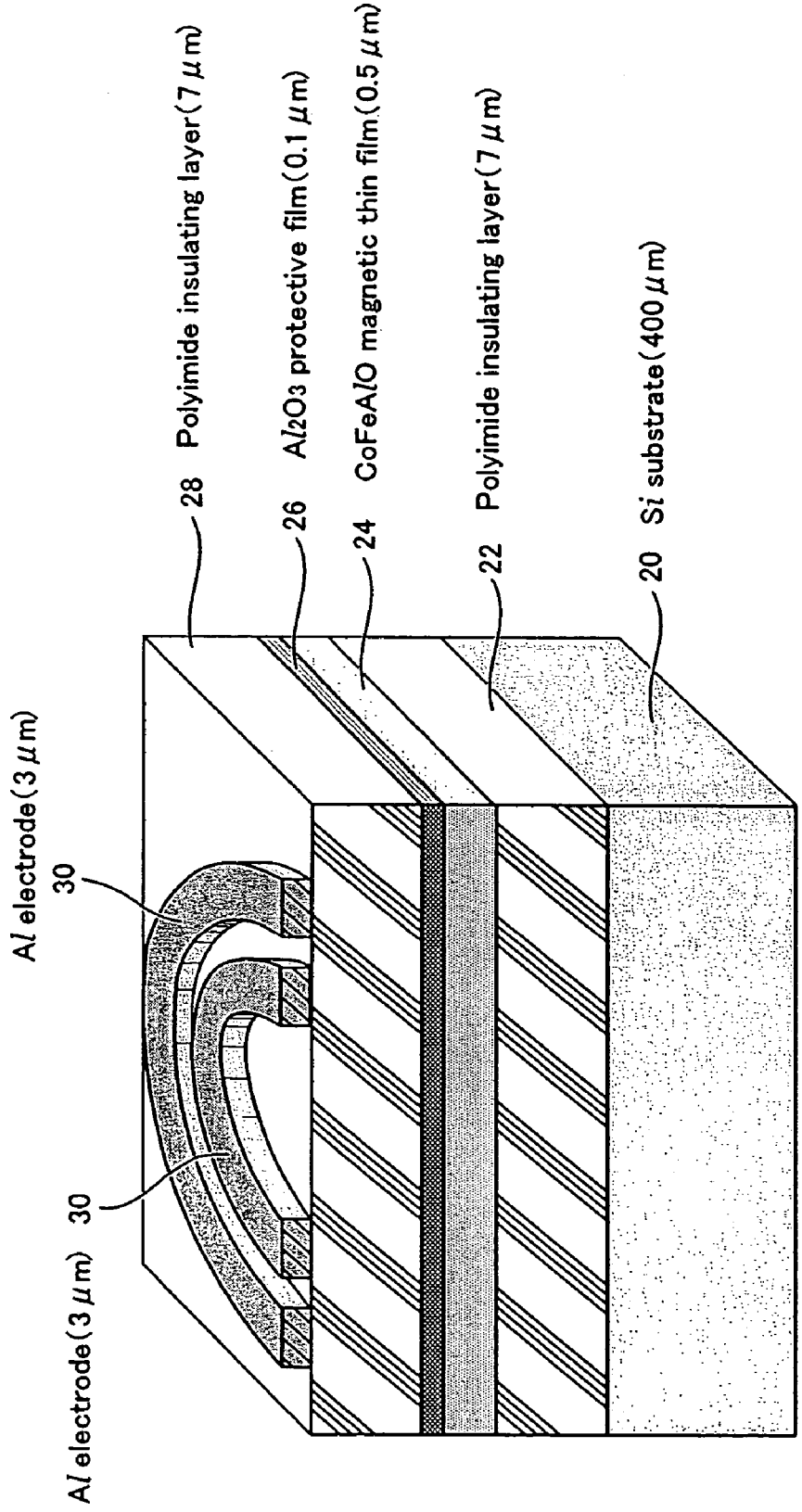
FIG. 5 is a principal sectional perspective view showing a thin film inductor according to Embodiment 2 of the present invention.

Next, Embodiment 2 will be described. This embodiment is one directed to a thin film inductor produced by mounting the previously mentioned nano-granular magnetic thin film. FIG. 5 shows its perspective view and the principal parts of the device are shown in section. In the Figure, a polyimide insulating layer 22 is first applied to the thickness of 7 μm to the principal surface of an Si substrate 20 of 400 μm in thickness by a suitable method such as a spin coater. Then, a magnetic thin film 24 of CoFeAlO according to the previously mentioned Embodiment 1 is formed to the thickness of 0.5 μm on the insulating layer 22 by the combination of a multi-target simultaneous sputtering and a nonreactive sputtering. A protective film (passivation film) 26 of $Al_2O_3$ is formed to the thickness of 0.1 μm on the magnetic thin film 24 by a suitable method such as sputtering. A polyimide insulating layer 28 is again formed to the thickness of 7 μm on the protective film 26 by a suitable method such as a spin coater. An electrode 30 which is a conductor for carrying electric current, is formed in a spiral form of 3 μm thick on the insulating layer 28 by using Al, for example.

It is to be noted that the insulating layers 22 and 28 are provided to reduce the capacitance components between them and the magnetic thin film 24. As the actual components, however, the insulating layers 22 and 28 may be reduced in thickness in order to positively form capacitance components.

Figure 6:
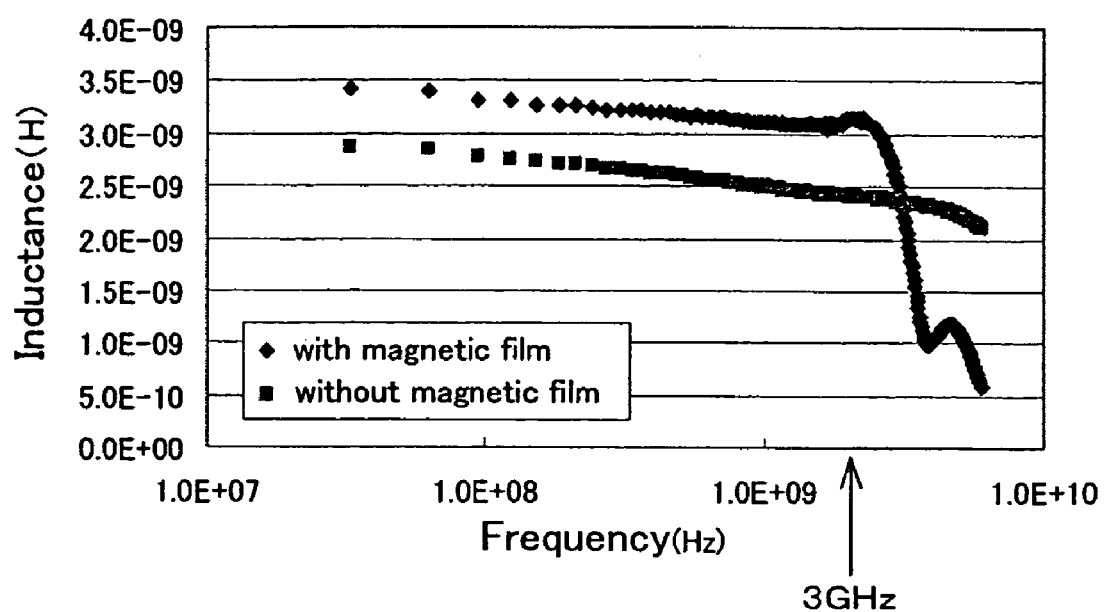
FIG. 6 is a graph showing an exemplary measurement of the frequency characteristics of the inductance in the above thin film inductor.

When a current is conducted to the electrode 30, it functions as an inductor owing to its spiral form. The magnetic flux produced by this conduction of current acts on the magnetic thin film 24 and thus an inductor of given characteristics is obtained. FIG. 6 shows the measurement results of inductance frequency characteristics of a thin film inductor made by trial manufacture as well as the characteristics of an inductor without a magnetic thin film. In the Figure, the abscissa represents the frequency and the ordinate represents the inductance. Also, the abscissa takes the form of a logarithmic scale and symbol E indicates the power of 10 on both of the abscissa and ordinate. For instance, "E-09" represents "$10^{-9}$".

As shown in the Figure, up to about 3 GHz, a higher inductance alue can be obtained in the case with the magnetic thin film 24 than in the case without the magnetic thin film 24. This increase in inductance value is considered to be due to the magnetic flux trapping effect by the magnetic thin film 24. Considering these results, it is conceived that the resonant frequency of the magnetic thin film 24 is over 3 GHz even if it is estimated at the minimum and adequate magnetic properties can be obtained in the high frequency band of 2 GHz.

Embodiment 3

Figure 7:
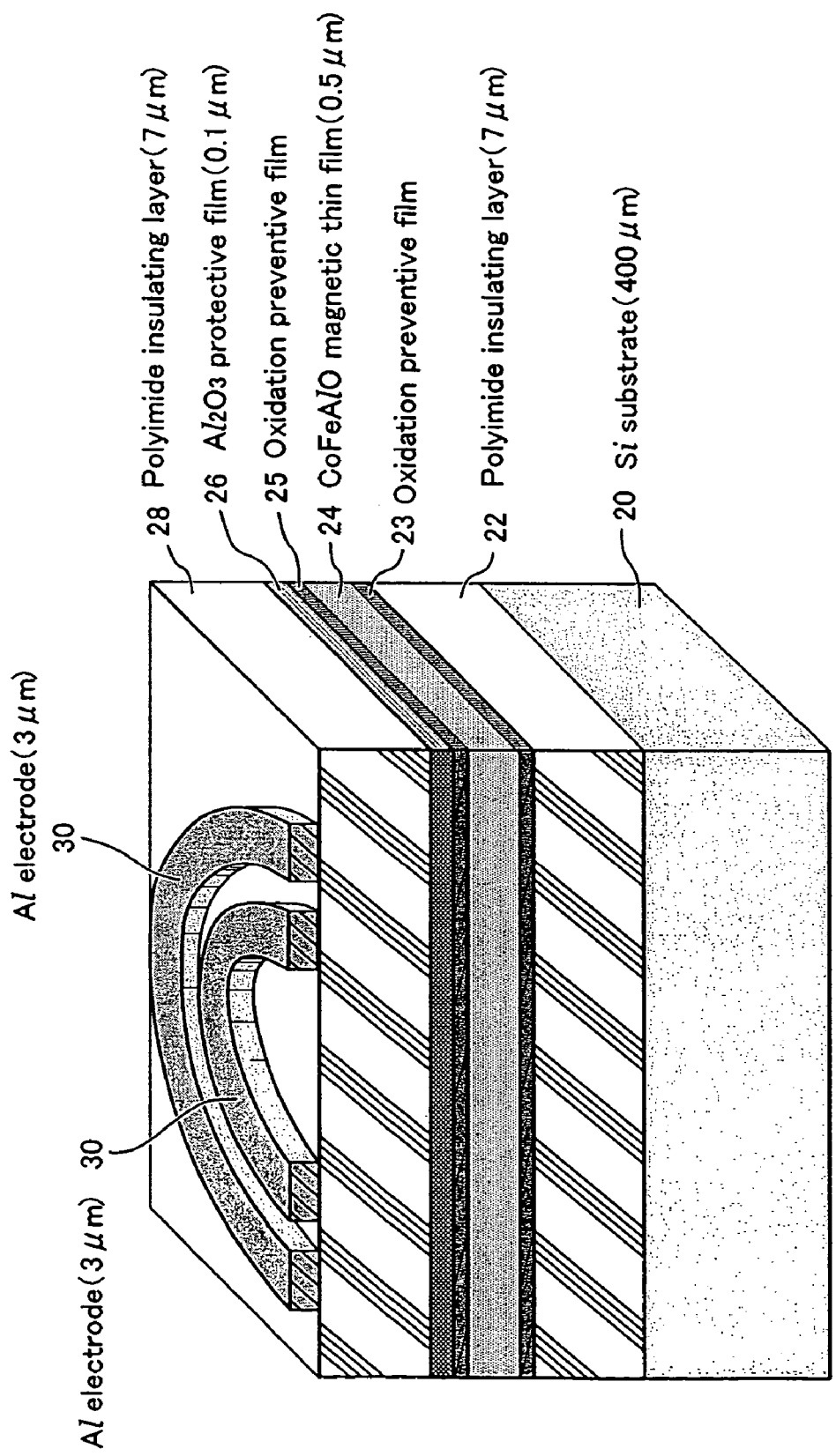
FIG. 7 is a principal sectional perspective view of a thin film inductor according to Embodiment 3 of the present invention.

Embodiment 3 will now be described. Embodiment 3 is one of more preferred forms of Embodiment 2 such that oxidation preventive films 23 and 25 are provided on the top and back surfaces of the magnetic thin film 24 as shown in FIG. 7. As mentioned previously, the present invention features that the magnetic metal of the magnetic thin film 24 is nonoxidizable. However, if the vacuum is ruined after the formation of the magnetic thin film 24, the magnetic metal of the magnetic thin film 24 combines with the oxygen and moisture in the air and it is oxidized, thus lowering the saturation magnetization and thereby deteriorating the magnetic properties as a whole. Conducting a treatment tending to heat the magnetic thin film 24 has the effect of advancing the oxidation of the magnetic metal.

Thus, in accordance with the present embodiment, the magnetic metal in the magnetic thin film 24 is prevented from being oxidized by forming the oxidation preventive films 23 and 25 on the top and back surfaces of the magnetic thin film 24. Suitable materials for the oxidation preventive films 23 and 25 include, for example, $Al_2O_3$ film and $SiO_2$ film.

Note that while, in the illustrated embodiment, the oxidation preventive films are provided on the top and back surfaces of the magnetic thin film 24, it is possible to provide the oxidation preventive film only one or the other of the two surfaces, particularly that surface tending to contact with oxygen. In addition, the protective film 26 also functions as an oxidation preventive film. Thus, it is possible to provide at least one of the oxidation preventive film 25 and the protective film 26 or their order of the lamination may be reversed.

Embodiment 4

Next, Embodiment 4 of the present invention will be described. While the above-mentioned Embodiments 1 to 3 have been described as applied to the granular magnetic thin film of the single layer structure, the present embodiment will be described as applied to a multilayered magnetic film formed by laminating magnetic layers and insulating layers (the same applies to the below-mentioned embodiments). The basic construction of the multilayered magnetic film of the present embodiment will be described first with reference to FIG. 8.

Figure 8:
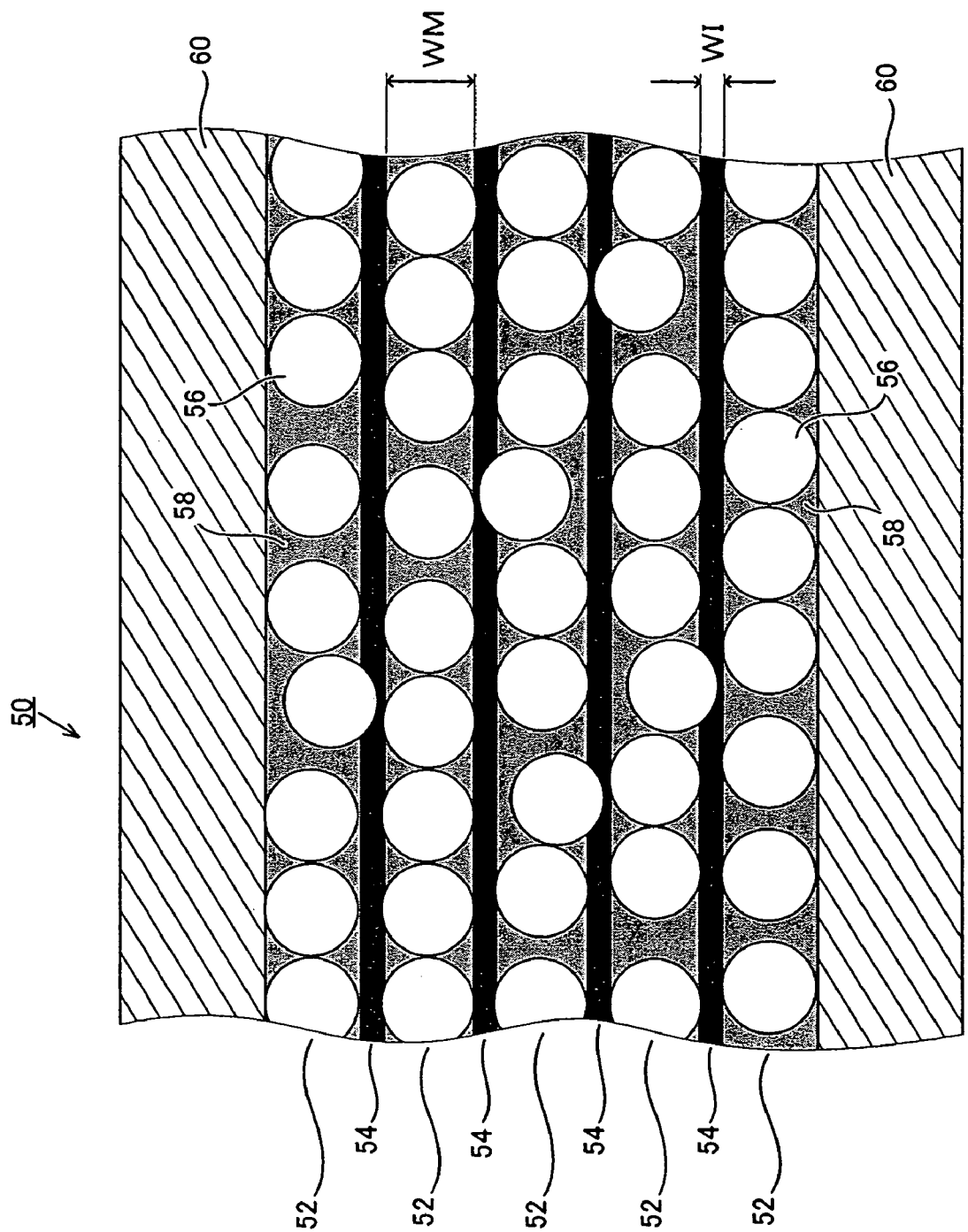
FIG. 8 is a principal sectional view showing the basic construction of a multilayered magnetic film according to the present invention.
Figure 9:
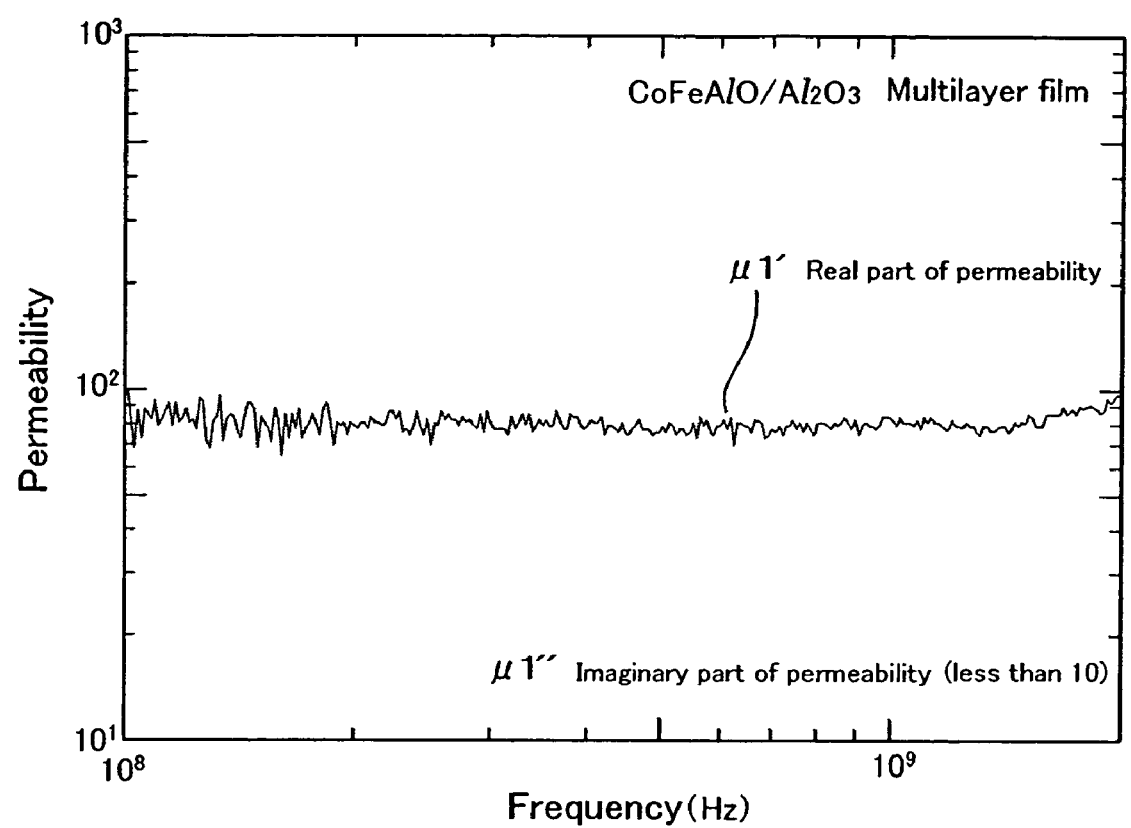
FIG. 9 is a series of graphs showing the frequency characteristics of the permeability in exemplary forms of the above multilayered magnetic film and comparative examples.
Figure 9:
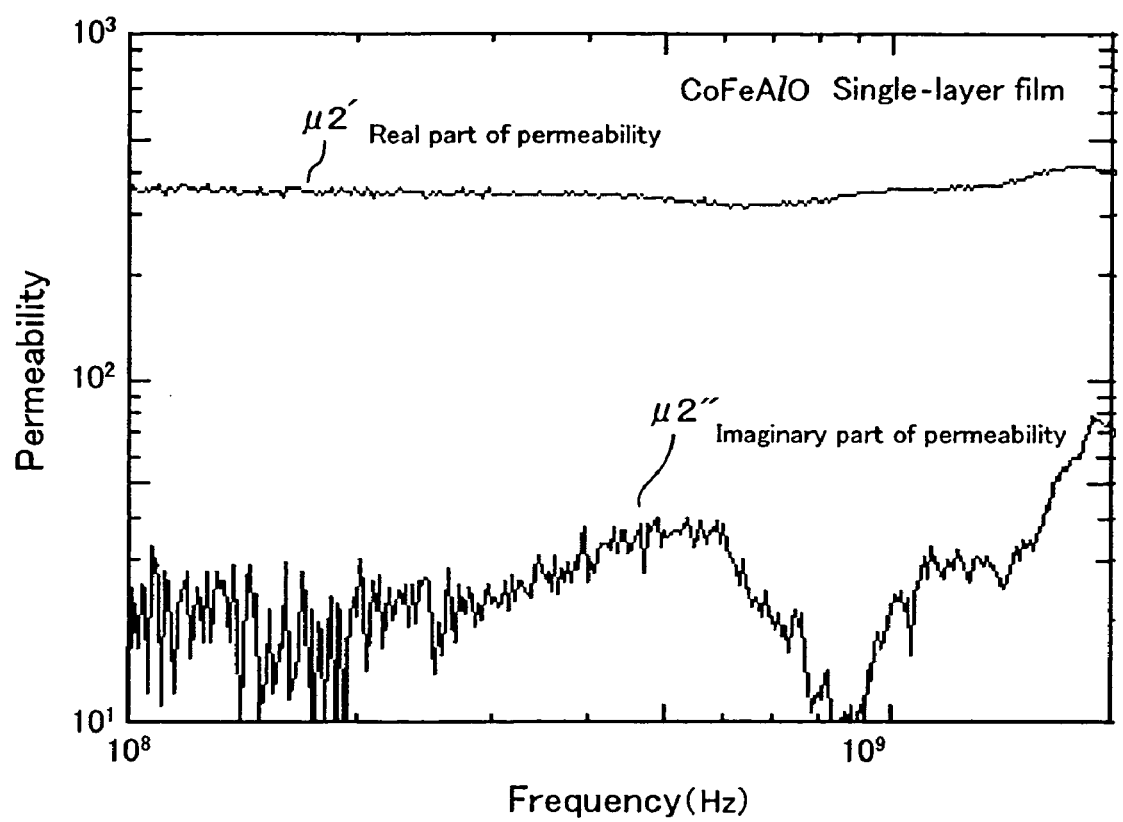
Figure 9:
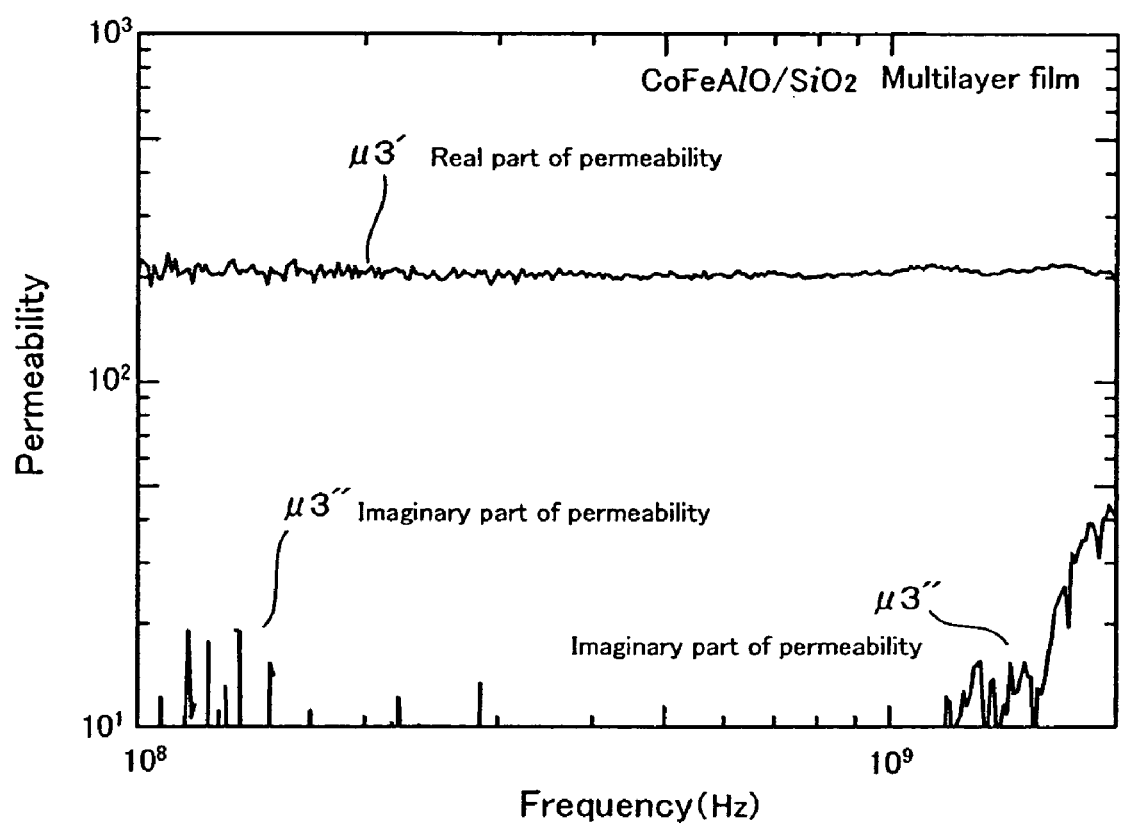
Figure 9:
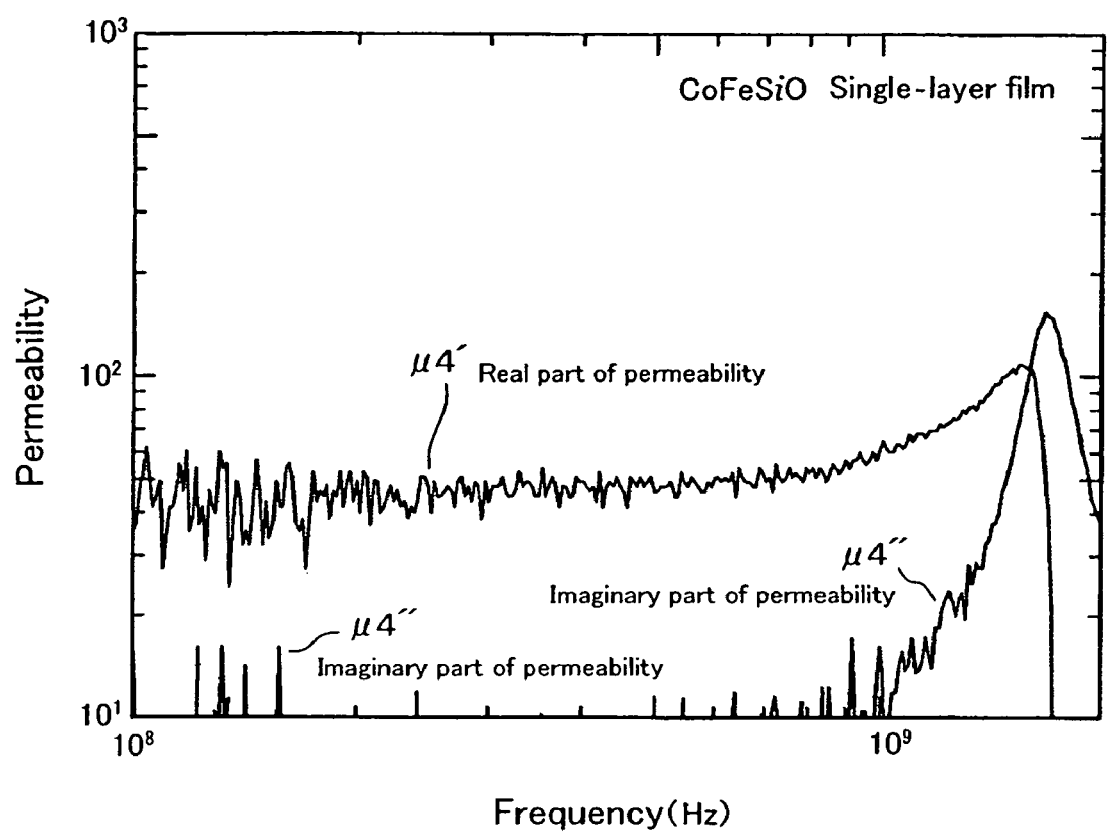
Figure 10:
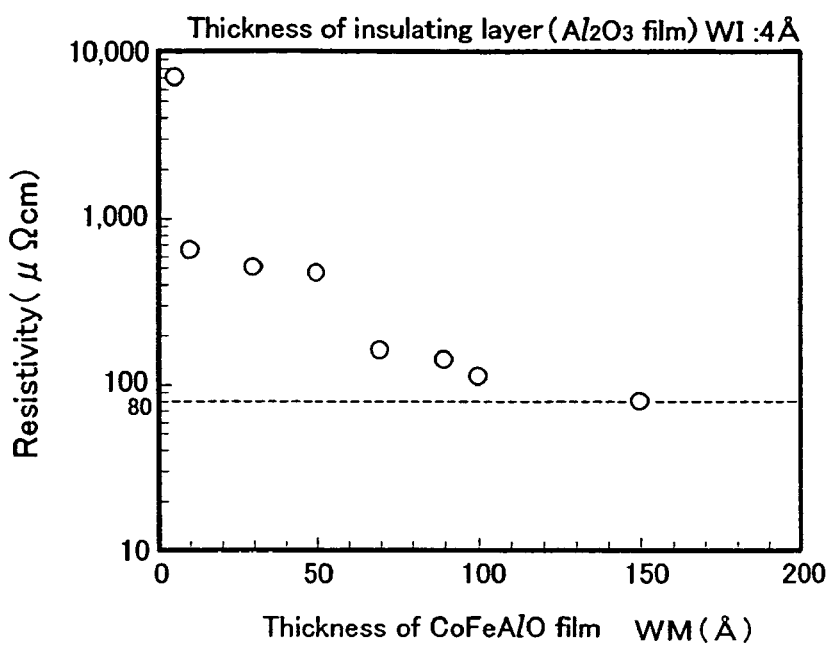
FIG. 10 illustrates graphs each showing the relation between the resistivity and the thickness of the magnetic layers in the above embodiment.
Figure 10:
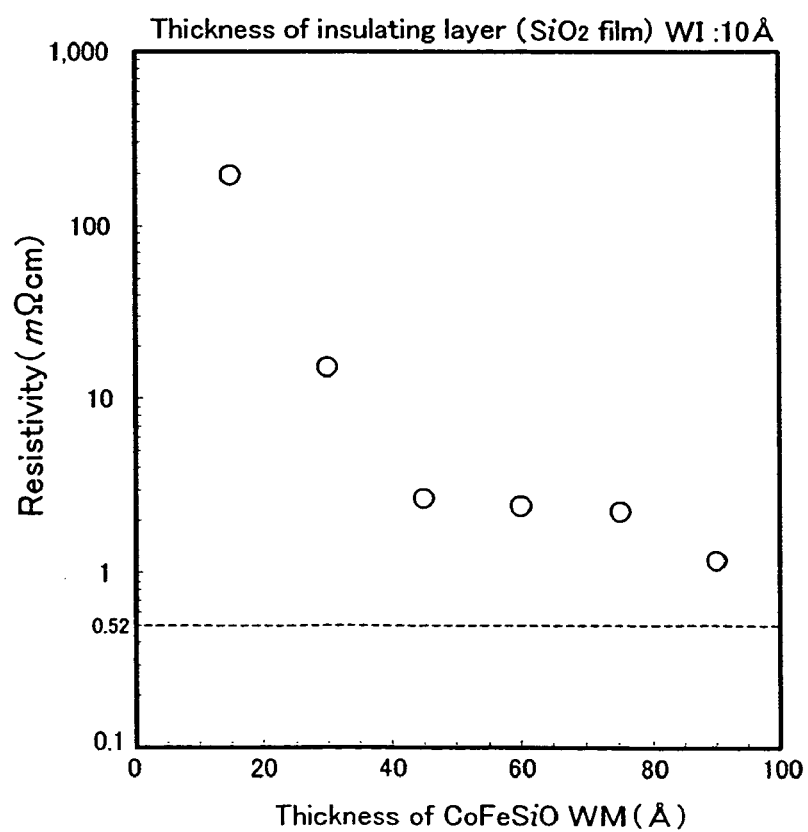
Figure 11:
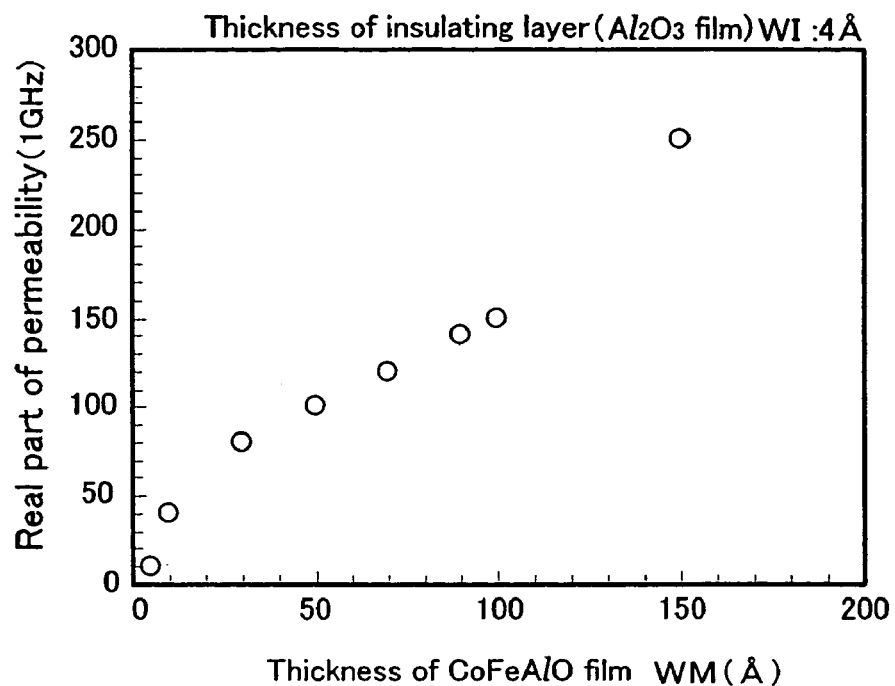
FIG. 11 illustrates graphs each showing the relation between the real part of the permeability and the thickness of the magnetic layers in the above embodiment.
Figure 11:
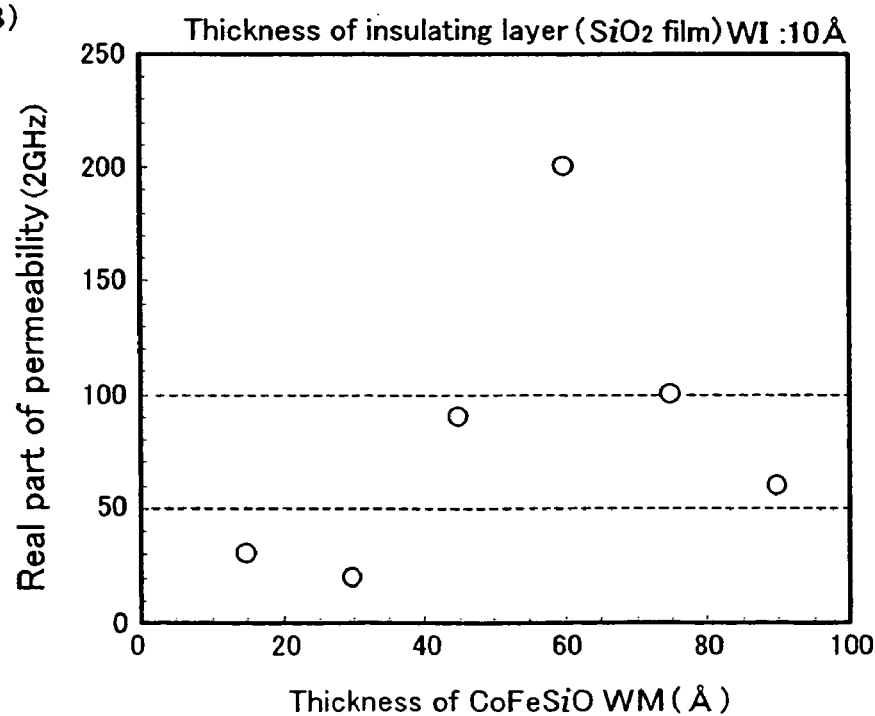
Figure 12:
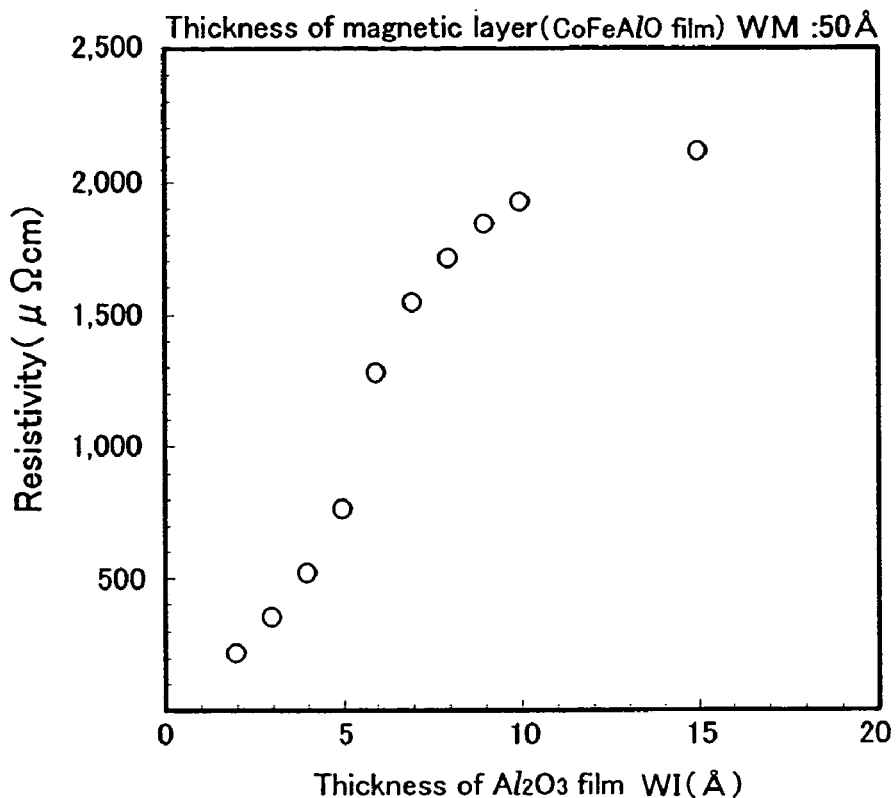
FIG. 12 illustrates graphs each showing the relation between the resistivity and the thickness of the insulating layers in the above embodiment.
Figure 12:
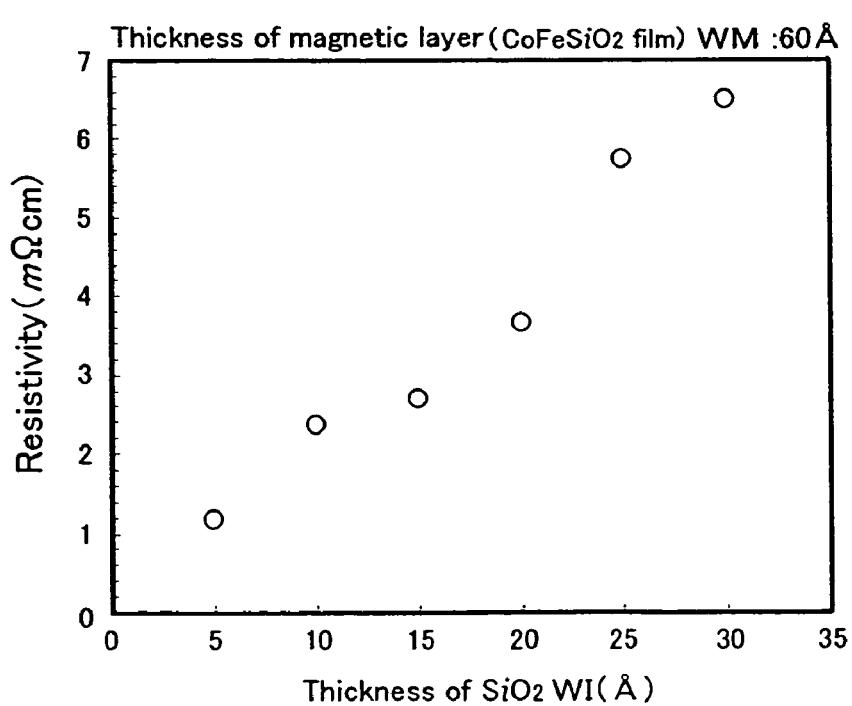
Figure 13:
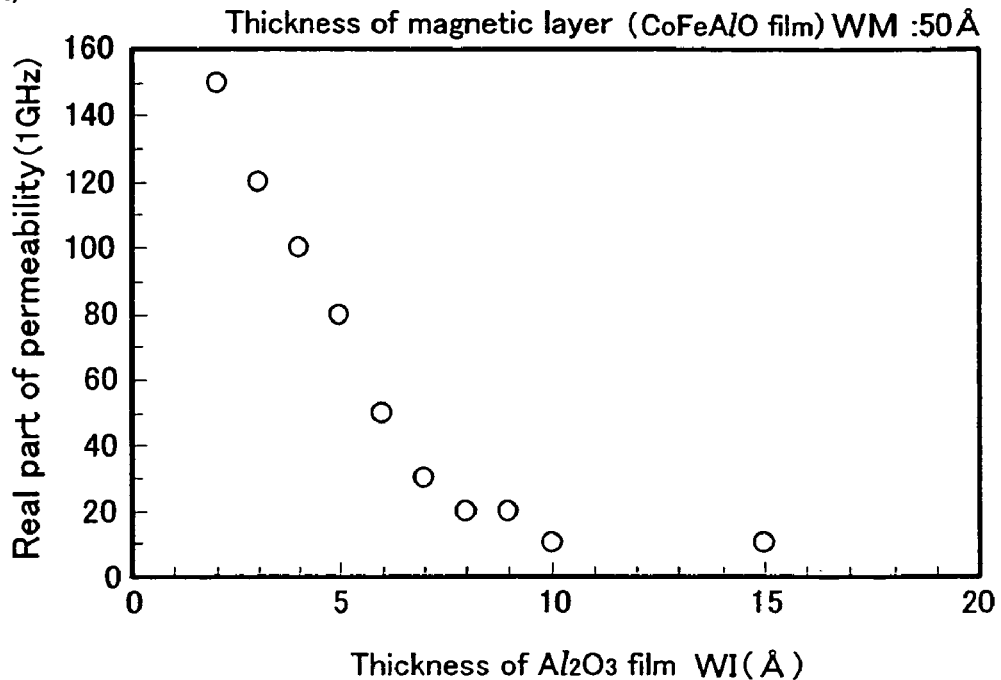
FIG. 13 illustrates graphs each showing the relation between the real part of the permeability and the thickness of the insulating layers in the above embodiment.
Figure 13:
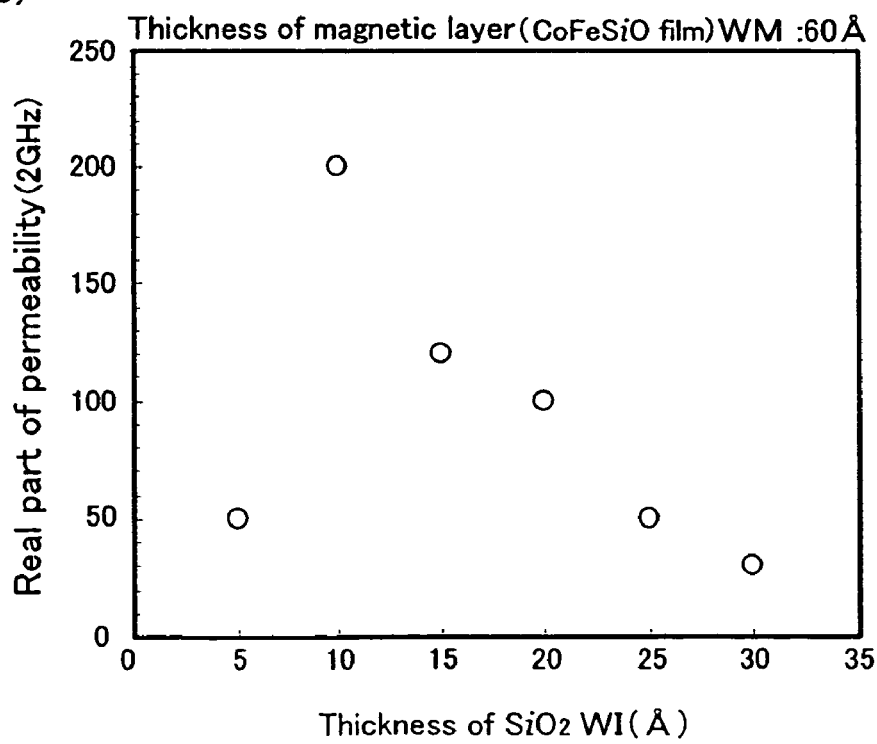

FIG. 8 is a principal sectional view of a multilayered magnetic film or multilayered granular film 50. As shown in the Figure, the multilayered magnetic film 50 has a multilayered structure formed by alternately laminating a plurality of magnetic layers 52 each composed of a granular thin film in which an insulating material 58 and nonoxidizable-metal magnetic grains (nonoxidizable magnetic grains) 56 are separately coexist and insulating layers 54 of a metal oxide.

Also, an oxidation preventive film 60 is provided on each of the top and back surfaces of the film 50. If the vacuum is broken during the manufacturing process, $O_2$ and $H_2O$ are deposited on the surface of the multilayered magnetic film 50. When a heat treatment or the like is performed in this condition, there is the danger of causing oxidation of the magnetic grains 56 in the magnetic layers 52. If the magnetic grains 56 are oxidized, the magnetic properties of the multilayered magnetic film 50 are deteriorated on the whole, particularly the saturation magnetization is deteriorated. In order to prevent such oxidation of the magnetic grains 56, the oxidation preventive films 60 are formed. The oxidation preventive films 60 may each be composed of the insulating material 58 formed to be relatively large in thickness. In addition, the oxidation preventive film 60 may be provided on each of the top and back surfaces of the multilayered film as shown in the Figure or alternatively it may be provided on either one of the two sides, particularly on the top surface side tending to contact with the outside air.

The present embodiment will now be described in detail with reference to FIGS. 9 to 13 in addition to FIG. 8. In this embodiment, the magnetic layers 52 of the multilayered magnetic film 50 are each formed of CoFeAlO film, whereas the insulating layers 54 are each formed of $Al_2O_3$ film. In one illustrative manufacturing method, a CoFe alloy target (Co:Fe=80:20 at % (atomic percentage)) and $Al_2O_3$ target are used as the targets for sputtering. Then, an Si substrate is prepared and a multilayered film (0.5 μm in film thickness) of the CoFeAlO films and the $Al_2O_3$ films is formed on the substrate by using the said targets alternately under the film forming conditions of ① a sputtering gas pressure of 0.42 Pa and ② a substrate temperature of 20° C.

FIG. 9(A) shows the frequency characteristics of permeability in a sample of the multilayered CoFeAlO/$Al_2O_3$ film or the multilayered magnetic film 50 manufactured in the previously mentioned way, and FIG. 9(B) shows the frequency characteristics of a CoFeAlO single-layer film by way of comparative example. In these Figures, the abscissa represents the frequency (Hz) and the ordinate represents the permeability (both are in the form of logarithms).

As shown in FIG. 9(A), the real part μ1' of the permeability of the CoFeAlO/$Al_2O_3$ multilayered film is on the order of 70 to 100. On the contrary, as shown in FIG. 9(B), the real part μ2' of the permeability of the CoFeAlO single-layer film is on the order of 300 to 400. A comparison between the two shows that the permeability real part of the CoFeAlO/$Al_2O_3$ multilayered film of the present embodiment is reduced to ⅓ to ¼ as compared with the CoFeAlO single-layer film.

However, a comparison between the imaginary parts of permeability shows that the imaginary part is considerably reduced in the CoFeAlO/$Al_2O_3$ multilayered film of FIG. 9(A) as compared with that in the CoFeAlO single-layer film shown in FIG. 9(B) and it is not practically observed. Thus, in view of the fact that the imaginary part μ1" of permeability is greatly decreased as compared with the imaginary part μ2", it will be seen that the use of the multilayered structure of the present embodiment has the effect of greatly reducing the eddy current loss. Also, the resonant frequency of the multilayered magnetic film 50 of the present embodiment is 2 GHz or over and thus it is satisfactorily usable in high frequency bands. Note that FIGS. 9(C) and 9(D) will be explained later.

Next, the thickness WM of the magnetic layer 52 (CoFeAlO film) will be examined. Note that the thicknesses of the magnetic layer 52 and the insulating layer 54 have been measured by mean of a crystal vibrator. FIG. 10(A) shows the relation between the resistivity and the thickness WM of the magnetic layer 52, with the abscissa showing the thickness WM (Å) of the magnetic layer 52 and the ordinate showing the resistivity (μΩcm). Also, FIG. 11(A) shows the relation between the real part of permeability and the thickness WM of the magnetic film 52 at 1 GHz, with the abscissa representing the thickness WM (Å) of the magnetic layer 52 and the ordinate representing the real part of permeability. In either of the cases, the thickness WI of the insulating layer 54 is fixed at 4 Å.

Firstly, when the thickness WM of the magnetic layer 52 is reduced, the resistance value increases and it abruptly rises with the thickness WM of less than 10 Å as shown in FIG. 10(A). In the range where the thickness WM of the magnetic layer 52 is less than the grain size of the magnetic grains 56, the grain growth of the magnetic grains 56 held between the insulating layers 54 is restricted. As a result, it is considered that a high electric resistance is obtained on the whole owing to the electric conduction preventive effect of the grain boundaries in addition to the effect of introduction of the insulating layers 54. Also, minimizing the size of the magnetic grains 56 has the effect of reducing the crystalline magnetic anisotropy and increasing the exchange interaction between the magnetic grains 56, with the resulting advantage from the soft magnetic property point of view.

On the other hand, when the thickness WM of the magnetic layer 52 exceeds 100 Å, the extent of increase in resistivity is decreased. This is considered due to the fact that if the thickness WM of the magnetic layer 52 exceeds 100 Å, there is the effect of causing the grain growth of the magnetic grains 56 in the magnetic layer 52 so that the effect of the reduced grain size is reduced and the increase in resistivity is decreased. When the thickness WM of the magnetic layers 52 reaches 150 Å, it is no longer possible to confirm any eminent difference over the CoFeAlO single-layer film having a resistivity of 80 μΩcm (not shown). Thus, in order to obtain a higher resistivity than in the case of the CoFeAlO single-layer film, the thickness WM of the magnetic layers 52 is selected 130 Å or less, preferably 100 Å or less. On the other hand, as shown in FIG. 11(A), the permeability decreases with reduction in the thickness WM of the magnetic layers 52. Particularly, if the thickness WM is 5 Å or less, the magnetic grains 56 are isolated so that a super paramagnetic behavior is exhibited and they fail practically to function as magnetic films.

Considering the foregoing relations of the resistivity and the permeability, the following results:

① From the resistivity point of view, it is desirable that WM≦130 Å, preferably WM≦100 Å.

② From the permeability point of view, it is desirable that 5 Å<WM, preferably 10 Å≦WM.

Thus, on the whole, it will be seen that the thickness WM of the magnetic layers 52 should be in such range that satisfies 5 Å<WM≦130 Å, more preferably 10 Å≦WM≦100 Å.

Next, the thickness WI of the insulating layer 54 ($Al_2O_3$ film) will be examined. FIG. 12(A) shows the relation between the resistivity and the thickness WI of the insulating layer 54, with the abscissa representing the thickness WI (Å) of the insulating layer 54 and the ordinate representing the resistivity (μΩcm). Also, FIG. 13(A) shows the relation between the real part of permeability and the thickness WI (Å) of the insulating layer 54 at 1 GHz, with the abscissa representing the thickness WI (Å) of the insulating layer 54 and the ordinate representing the real part of permeability. In either of the cases, the thickness WM of the magnetic layer 52 is fixed at 50 Å.

Considering first that the resistivity of the CoFeAlO single-layer film is 80 μΩcm, as shown in FIG. 12(A), the resistivity is increased greatly with increase in the thickness WI of the insulating layer 54 and thus it is possible to confirm that a higher resistance is produced by the introduction of the insulating layer 54. On the other hand, as shown in FIG. 13(A), the value of the permeability real part is decreased with increase in the thickness WI of the insulating layer 54. This is due to the fact that increasing the thickness WI of the insulating layer 54 has the effect of decreasing the exchange interaction between the magnetic grains 52 holding the insulating layer 54 therebetween and its effect is increased if the thickness WI exceeds 10 Å. In particular, the magnetic layer 52 fails to effectively function as a magnetic film when the thickness WI is 15 Å.

From the foregoing results it will be seen that the following holds with respect to the thickness WI of the insulating layer 54:

① Greater the thickness is, it will be better from the resistivity point of view, ② From the standpoint of permeability, it is preferable that WI≦10 Å, ③ From the standpoints of both resistivity and permeability, a preferred range is 5 Å≦WI≦8 Å.

Thus, on the whole, a preferred range for the thickness WI of the insulating layer 54 should be WI≦10 Å, preferably 5 Å≦WI≦8 Å. Thus, according to the present embodiment, the thickness WM of the magnetic layer 52 is selected to fall in a range that satisfies 5 Å<WM≦130 Å, preferably 10 Å≦WM≦100 Å, the thickness WI of the insulating layer 14 is selected to fall in a range that satisfies WI≦10 Å, preferably 5 Å≦WI≦8 Å, and a plurality of these layers are laminated to produce the multilayered magnetic film 50, thereby obtaining the following effects:

① Due to the introduction of the insulating layers 54, the electric resistance is increased and the eddy current loss is reduced, and ② Due to the fact that the insulating layers 54 prevent the grain growth of the magnetic grains 56 with the resulting reduction in grain size, the grain boundary density is increased to increase the electric resistance and the crystalline magnetic anisotropy is decreased to improve the soft magnetic properties.

Embodiment 5

Figure 14:
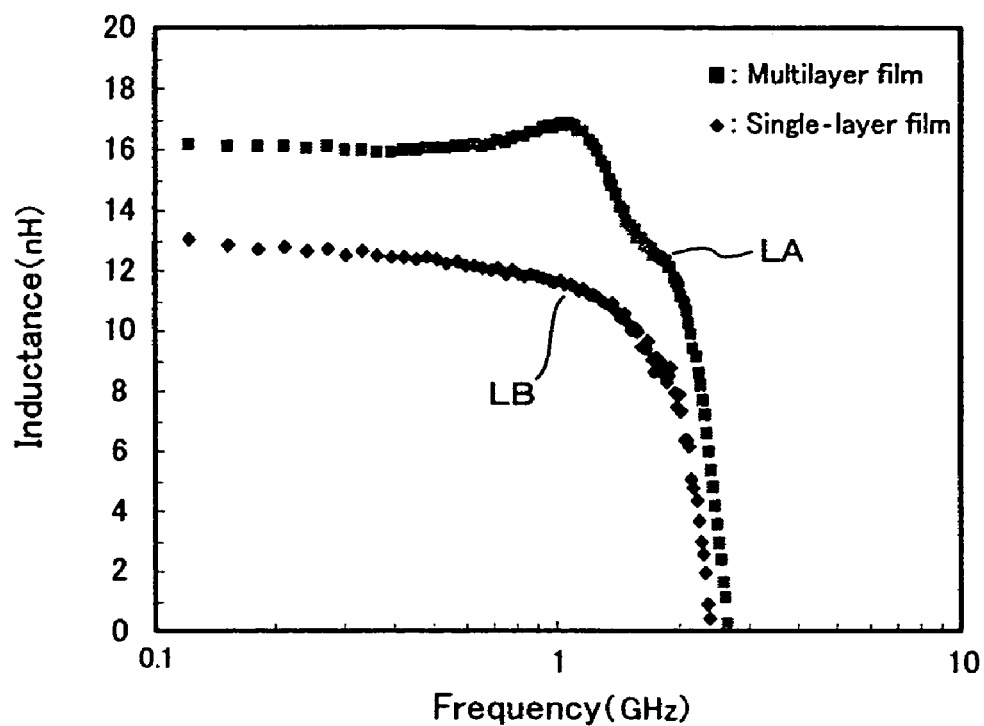
FIG. 14 illustrates graphs respectively showing the inductance frequency characteristics of a thin film inductor utilizing the multilayered magnetic film(s) of the above embodiment and a comparative example.
Figure 14:
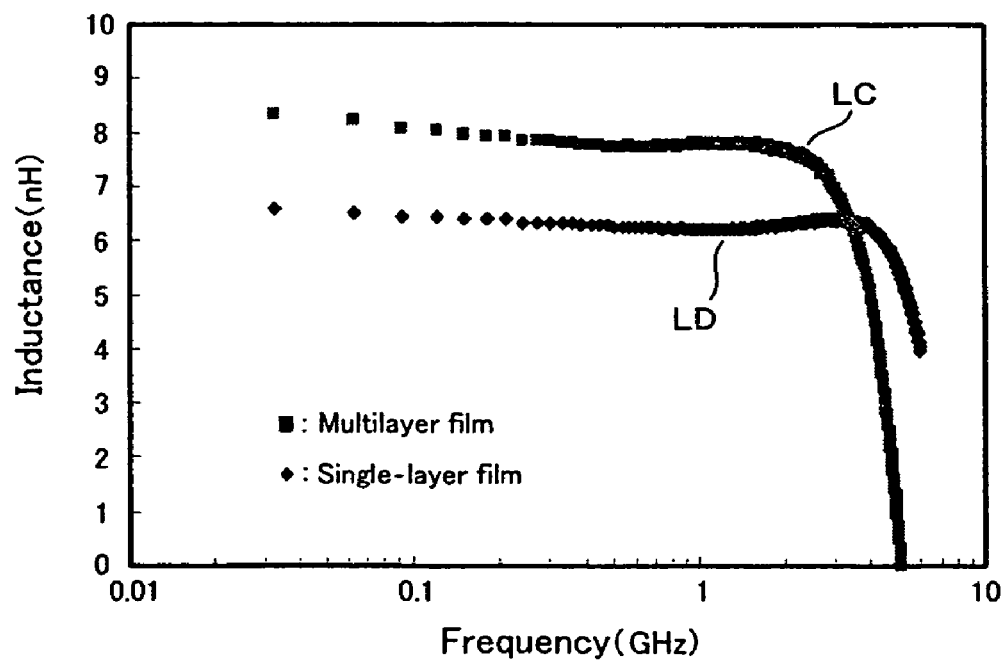

A thin film inductor according to Embodiment 5 of the present invention will now be described with reference to FIG. 14(A). The thin film inductor of the present embodiment has been manufactured by utilizing the multilayered magnetic film 50 described in connection with the previously mentioned Embodiment 4. FIG. 14(A) shows the frequency characteristics of the inductance LA of the thin film inductor composed of the multilayered film and the frequency characteristics of the inductance LB of an inductor manufactured by using a single layer film by way of comparative example for the purposes of comparison. In the Figure, the abscissa represents the frequency (Hz) and the ordinate represents the inductance (nH).

As shown in FIG. 14(A), a comparison between the inductance LA in the case of the multilayered film and the inductance LB in the case of the single-layer film shows that the inductance LA of the thin film inductor of the present embodiment is higher in value than the inductance LB of the thin film inductor composed of the single-layer film. This is considered to be due to the fact that the resistance value is high as compared with the case utilizing the single-layer film so that the eddy current loss is reduced, the parasitic capacity with respect to the electrode wirings is reduced and the loss of the thin film inductor is decreased considerably. Also, as described in connection with the above-mentioned Embodiment 4, it is considered that the reduced imaginary part of the permeability due to the multilayered structure (see FIG. 9(A)) also has an effective action on the reduction of loss. Thus, by using the magnetic material film increased in resistance due to the multilayered structure as a magnetic core material, it is possible to obtain a thin film inductor well suited for use in high frequency bands.

Embodiment 6

Embodiment 6 of the present invention will now be described with reference to FIG. 9 to FIG. 13. The multilayered structure of the present embodiment is also the same as in FIG. 8. In the case of the present embodiment, however, in the multilayered magnetic film 50 the magnetic layers 52 are each composed of CoFeSiO film and the insulating layers 54 are each composed of $SiO_2$ film. According to its exemplary manufacturing method, a CoFe alloy target (Co:Fe=80:20 at %) and an $SiO_2$ target are used as the targets for sputtering. Then, an Si substrate of 400 µm thick is prepared and the targets are alternately sputtered onto its surface (100) under the film forming conditions including ① sputtering gas pressure of 0.42 Pa and ② substrate temperature of 20° C., thereby forming a multilayered film (film thickness of 0.5 µm) of the CoFeSiO films and $SiO_2$ films.

FIG. 9(C) shows the frequency characteristics of the permeability in a sample of the multilayered magnetic film 50 or the CoFeSiO/$SiO_2$ mltilayered film produced in the foregoing manner, and FIG. 9(D) shows the frequency characteristics of the CoFeSiO single-layer film or the comparative device. In each of these Figures, the abscissa represents the frequency (Hz) and the ordinate represents the permeability (the both are in the form of logarithms). As shown in FIG. 9(C), the real part µ3' of the permeability of the CoFeSiO/$SiO_2$ multilayered film is on the order of 200. On the other hand, as shown in FIG. 9(D), the real part µ4' of the permeability of the CoFeSiO single-layer film is on the order of 30 to 90. A comparison between the two shows that the real part of the permeability in the CoFeSiO/$SiO_2$ multilayered film of the present embodiment is increased to 2 to 7 times as compared with the CoFeSiO single-layer film.

On the other hand, while the imaginary part µ3" of permeability is observed to be greater than in Embodiment 4 shown in FIG. 9(A), it is small enough as compared with FIG. 9(B). Also, it is slightly small as compared with the CoFeSiO single-layer film of FIG. 9(D). Thus, since the imaginary part of permeability is made small in this way, the eddy current loss is greatly decreased even by the multilayered structure of the present embodiment. Further, the resonant frequency of the multilayered magnetic film 50 of the present embodiment is 2 GHz or over and it can be adequately used in high frequency bands.

Next, the thickness WM of the magnetic layer 52 (CoFeSiO film) will be examined. Note that the film thicknesses of the magnetic layer 52 and the insulating layer 54 have been measured by means of a crystal vibrator. FIG. 10(B) shows the relation between the resistivity and the thickness WM of the magnetic layer 12, with the abscissa representing the thickness WM (Å) of the magnetic layer 52 and the ordinate representing the resistivity (m Ωcm, logarithmic representation). Also, FIG. 11(B) shows the relation between the real part of permeability and the thickness WM of the magnetic layer 52 at 2 GHz, with the abscissa showing the thickness WM (Å) of the magnetic layer 52 and the ordinate representing the real part of permeability. In either of the cases, the thickness WI of the insulating layer 54 is fixed at 10 Å.

Firstly, as shown in FIG. 10(B), the resistance value increases with decrease in the thickness WM of the magnetic layer 52 and it increases with a large slope when the thickness WM is 45 Å or less. Thus, it will be seen that in view of the resistivity values, smaller the thickness WM of the magnetic layer 52 is, it will be more suited. According to the present embodiment, so far as the thickness WM of the magnetic layers 52 is less than the grain size of the magnetic grains 56, the grain growth of the magnetic grains 56 held between the insulating layers 54 is restricted. Thus, it is considered that a high electric resistance on the whole is obtained by virtue of the electric conduction preventing effect due to the grain boundaries as well as the effect of the introduction of the insulating layers 54. As in the case of Embodiment 4, the soft magnetic properties are improved owing to the reduced crystalline magnetic anisotropy and the increased exchange interaction between the magnetic grains 56 which are brought about by the reduced size of the magnetic grains 56.

On the other hand, when the thickness WM of the magnetic layers 52 exceeds 45 Å, the extent of increase in the permeability is decreased. This is considered to be due to the fact that when the thickness WM of the magnetic layers 52 exceeds 45 Å, the grain growth preventing effect of the insulating layers 54 is reduced so that the effect of the reduced grain size is decreased and the increase in resistivity is decreased. Also, where the thickness WM of the magnetic layers 52 is at least on the order of 90 Å, the resistivity is greater than the resistivity of the CoFeSiO single-layer film which is 0.52 m Ωcm (not shown), thereby confirming the effect resulting from the multilayered structure. Therefore, in order to obtain a higher resistivity than in the case of the CoFeSiO single-layer film, the thickness WM of the magnetic layers 52 is selected less than 90 Å.

Further, as shown in FIG. 11(B), the value of permeability becomes maximum when the thickness WM of the magnetic layers 52 is 60 Å. The value of permeability is 100 or over when the thickness WM of the magnetic layers 52 is between 50 and 75 Å, and the value of permeability is 50 or over when the thickness WM is between 40 and 90 Å. When the thickness of the magnetic layers 52 is 40 Å or less, the magnetic grains 56 become excessively small to exhibit a super paramagnetic behavior and this is considered to have an effect on the decrease in permeability. Here, the fact that the thickness range of the magnetic layers that exhibits super paramagnetic properties is greater than in the case of the CoFeAlO film of the previously mentioned Embodiment 4 is considered to be due to the fact that the volumetric ratio of the magnetic material in the magnetic layers of CoFeSiO films is greater than in those composed of the CoFeAlO films. On the other hand, where the thickness of the magnetic layers 52 is 90 Å or over, the decrease in permeability is affected by the increase in crystalline magnetic anisotropy due to the increase in grain size of the magnetic grains 56. In the light of these view points, the advantageous range of thickness of the magnetic layers 52 is from 40 to 90 Å, preferably from 50 to 75 Å.

In consideration of the foregoing relations of the resistivity and permeability, the following holds:

① WM≦90 Å is desired from the resistivity point of view, and

② 40 Å≦WM≦90 Å, preferably 50 Å≦WM≦75 Å is desired from the permeability point of view. Thus, it will be seen that the thickness WM of the magnetic layers should, on the whole, be in such range that satisfies 40 Å≦WM≦90 Å, preferably 50 Å≦WM≦75 Å.

Next, the thickness WI of the insulating layers 54 will be examined. FIG. 12(B) shows the relation between the resistivity and the thickness WI of the insulating layers 54, with the abscissa representing the thickness WI (Å) of the insulating layers 54 and the ordinate representing the resistivity (m Ωcm). FIG. 13(B) shows the relation between the real part of the permeability at 2 GHz and the thickness WI (Å) of the insulating layers 54, with the abscissa representing the thickness WI (Å) of the insulating layers 54 and the ordinate representing the permeability real part. In either of the cases, the thickness WM of the magnetic layers 52 is fixed at 60 Å.

Firstly, as shown in FIG. 12(B), the resistivity increases practically in proportion to the thickness WI of the insulating layers 54. Since it is advantageous for the value of resistivity to be as high as possible, it will be seen that the insulating layers 54 should preferably be as thick as possible. On the other hand, as shown in FIG. 13(B), the value of permeability becomes maximal when the thickness of the insulating layers 54 is 10 Å. It is considered that if the thickness WI of the insulating layers 54 is made greater than 10 Å, the exchange interaction between the magnetic grains adjoining through the insulating layer 54 is decreased to decrease the permeability. Also, the permeability is low when the thickness WI of the insulating layers 54 is 5 Å or less. This is considered to be due to the fact that the inherent properties are not allowed to exhibit because of the excessive thinness of the insulating layers 54. In this connection, the fact that the thickness range differs from that of Embodiment 1 is considered to be due to the difference between the two embodiments with respect to the volumetric ratio of the insulating material in the magnetic layers. Judging from these standpoints, it is considered that the proper range for the thickness WI of the insulating layers 54 is from 5 to 25 Å, preferably from 7 to 20 Å.

In view of the foregoing results, the following holds for the thickness WI of the insulating layers 54.

① The thickness should preferably be as large as possible from the resistivity point of view.

② The range should be 5 Å≦WI≦25 Å, preferably 7 Å≦WI≦20 Å from the permeability point of view.

③ Thus, the range desired from both the resistivity and permeability points of view should be 5 Å≦WI≦25 Å, preferably 7 Å≦WI≦25 Å, more preferably 7 Å≦WI≦20 Å.

Thus, according to the present embodiment, the range of the thickness WM of the magnetic layers 52 is selected 40 Å≦WM≦90 Å, more preferably 50 Å≦WM≦75 Å, whereas the range of the thickness WI of the insulating layers 54 is selected 5 Å≦WI≦25 Å, preferably 7 Å≦WI≦25 Å, more preferably 7 Å≦WI≦20 Å, and a plurality each of these layers are laminated to produce a multilayered magnetic film 50, thereby ensuring the same effects as the previously mentioned Embodiment 4. Particularly, as compared with Embodiment 4, it is easier to obtain a structure in which the magnetic grains 56 are enclosed by $SiO_2$ insulating films and the desired electric conduction preventive effect is ensured by not only the insulating layers but also the grain boundaries, thereby ensuring a higher electric resistance.

Embodiment 7

A thin film inductor according to Embodiment 7 of the present invention will now be described with reference to FIG. 14(B). The thin film inductor of the present embodiment is manufactured by utilizing the multilayered magnetic film explained in connection with the previously mentioned Embodiment 6. FIG. 14(B) shows a comparison between the frequency characteristics of the inductance LC of the thin film inductor composed of the multilayered film and the frequency characteristics of the inductance LD of an air-core inductor as a comparative example. In the Figure, the abscissa represents the frequency (Hz, logarithmic representation) and the ordinate represents the inductance (nH).

As shown in the Figure, it will be seen from a comparison between the inductances LC and LD that the inductance LC of the present embodiment is higher than the inductance LD of the comparative example in frequency bands lower than 3.5 GHz. Regarding the inductances at 2 GHz, the inductance of the present embodiment is 7.65 nH which is higher than 6.24 nH of the air-core inductor by 1.41 nH (corresponding to 23% in terms of air-core ratio) and thus the thin film inductor of the present embodiment is satisfactorily applicable to inductors in the GHz bands. Since the inductances of the present embodiment and the comparative example become equal to each other at the frequency of 3.6 GHz, it is considered that the resonant frequency of the present multilayered magnetic material film is 3 GHz or over. From this fact it will be seen that the multilayered magnetic film of Embodiment 6 is much effective as a magnetic core material for an inductor used in high frequency bands.

Embodiment 8

Figure 15:
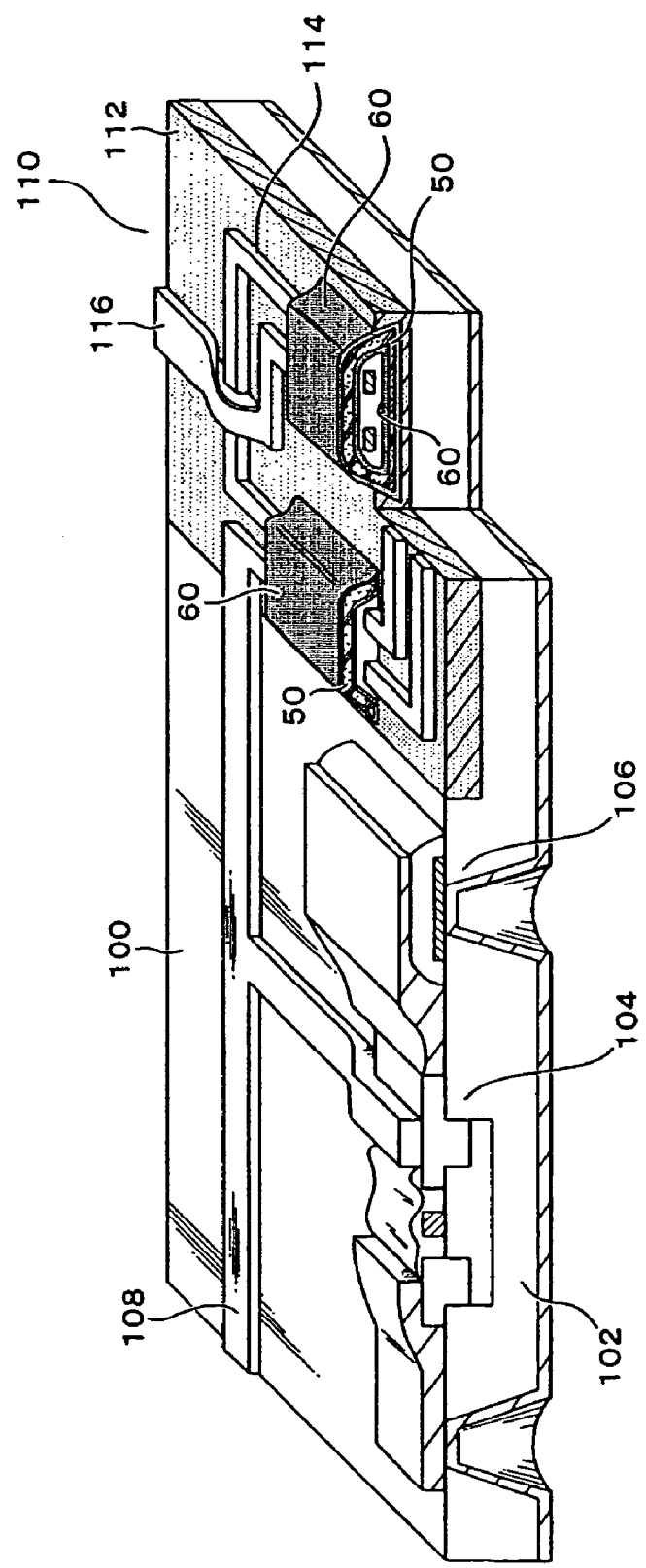
FIG. 15 is a perspective view showing an exemplary embodiment of the magnetic components and electronic equipment of the present invention.

Embodiment 8 of the present invention will now be described with reference to FIGS. 15 and 16. FIG. 15 shows an example of an MMIC (monolithic microwave integrated circuit) which is an electronic equipment utilizing the multilayered magnetic film according to the present invention. The MMIC is designed for performing signal amplification or modulation/demodulation in the microwave region and it is constructed so that such elements as a transistor, a resistor, a capacitor, an inductor, etc., are combined and integrated in one chip. In the illustrated example, a transistor 102, a resistor 104, an MIM (metal insulator metal) capacitor 106 and a microstrip line 108 are respectively formed on a semiconductor substrate 100 and a spiral inductor 110 is formed as a magnetic component on an interlayer insulating film 112.

The spiral inductor 110 of magnetic material loading closed magnetic path construction, shown in partially broken form, includes a conductor 114 formed in a spiral pattern so that one end is connected to the microstrip line 108 and the other end is connected to a lead-out electrode 116. Then, multilayered magnetic films 50 of the previously mentioned construction are formed so as to cover the conductor 114. An oxidation preventive film 60 is formed on the surface of each multilayered magnetic film 50.

Figure 16:
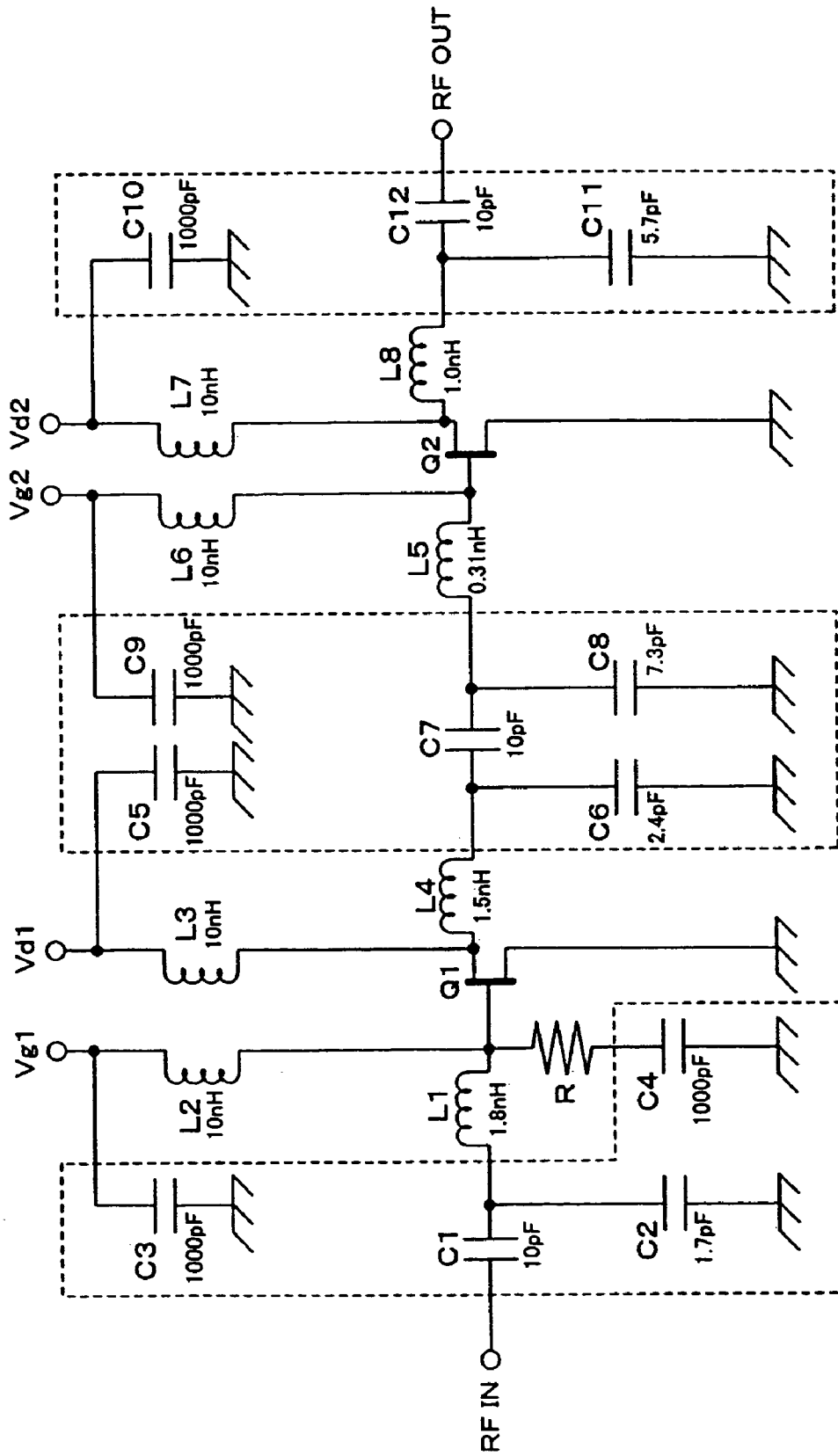
FIG. 16 is a circuit diagram showing an exemplary equivalent circuit of an MMIC to which the present invention is applied.

FIG. 16 shows an example of an equivalent circuit for a two-stage power amplifier constructed with such MMICs. A high frequency signal applied to an input terminal (RF IN) is amplified by a first-stage amplifier mainly composed of a transistor Q1 and a second-stage amplifier mainly composed of a transistor Q2, respectively, and it is generated from an output terminal (RF,OUT). In the circuit diagram, the transistors Q1 and Q2 are constructed like the transistor 102, and capacitances C1 to C12 are constructed like the capacitor 106. Also, inductances L1 to L8 are constructed like the spiral inductor 110, and a resistor R is constructed like the resistor 104.

When the multilayered magnetic films 50 of the present invention are used in the spiral inductor 110, the inductance per unit length of the conductor 114 is increased. Thus, the length of the conductor 114 can be decreased so that the occupied area of the spiral inductor 110 on the substrate is decreased on the whole. Also, the length of the conductor 114 is decreased so that the series resistance is also decreased.

In the case of the two-stage power amplifier shown in FIG. 16, a total of 8 units of the inductor are present. All of them are miniaturized and thus a considerable miniaturization of the MMICs on the whole can be attained.

Other Embodiments

The present invention involves a number of embodiments and it is possible to make a variety of changes and modifications to the embodiments in accordance with the foregoing disclosure. For instance, the following changes and modifications may be involved.

(1) While the CoFe alloy is used for the magnetic grains in the foregoing embodiments, a variety of magnetic metals may be used. For instance, NiFe and the like may be used. Also, while the oxide ceramic or $Al_2O_3$ is used for the insulating material, other amorphous insulating materials may be used. Also, MgO, $SiO_2$, oxides which are stable chemically, e.g., oxides of rare-earth elements and the like are well suited for the purpose.

(2) The materials shown for the magnetic layers 52 and the insulating layers 54 in the foregoing embodiments are by way of examples and they may be suitably replaced so as to ensure the similar functions.

(3) The film forming conditions shown in the foregoing embodiments are exemplary conditions and any suitably preset conditions may be used so as to obtain the desired properties. This is also the same with the numbers of lamination layers for the magnetic layers 52 and the insulating layers 54 and the film forming conditions of the multilayered magnetic film 50.

(4) While, in the forgoing embodiments, the thin film inductor is shown as an example of magnetic components and the MMIC is shown as an exemplary electronic equipment, the present invention may be applied to a variety of magnetic components and equipment which are usable in high frequency bands, e.g., thin film transformer, and it is possible to use them in such equipment as portable telephones. Further, while, in the foregoing embodiments, the MMIC employing multilayered magnetic films is shown by way of example, it may be replaced with an MMIC using granular magnetic thin films.

INDUSTRIAL APPLICABILITY

As described hereinabove, the present invention has the following effects.

(1) Since the nonreactive sputtering is performed, there is no danger of the magnetic metal being oxidized. Thus, the saturation magnetization is increased to increase the resonant frequency of the permeability and use of the present invention in high frequency bands (especially at 2 GHz or over) is made possible.

(2) Since the thickness of the insulating material is set between 0.5 nm and 1.5 nm due to the combination of the multi-target simultaneous sputtering and the nonreactive sputtering, excellent soft magnetic properties are obtained and the eddy current is also restricted to decrease its loss.

(3) Since the magnetic layers each composed of a granular film in which magnetic grains are enclosed by an insulating material and the insulating layers are alternately laminated so that the growth of the magnetic grains is prevented by the insulating layers to reduce the grain size, there is the effect of ensuring the improved electric resistance and the improved soft magnetic properties.

(4) By virtue of the fact that the magnetic films are each composed of CoFeAlO film and the insulating layers are each composed of $Al_2O_3$ film, and that the thickness WM of the magnetic layers is selected to fall in a range satisfying $5 Å < WM \leq 130 Å$, preferably $10 Å \leq WM \leq 100 Å$ and the thickness WI of the insulating layers is selected to fall in a range satisfying $WI \leq 10 Å$, preferably $5 Å \leq WI \leq 8 Å$, there is the effect of ensuring the improved electric resistance and the improved magnetic properties.

(5) By virtue of the fact that the magnetic layers are each composed of CoFeSiO film and the insulating layers are each composed of $SiO_2$ film, and that the thickness WM of the magnetic layers is selected to fall in a range satisfying 40 Å≦WM≦90 Å, preferably 50 Å≦WM≦75 Å, and the thickness WI of the insulating layers is selected to fall in a range satisfying 5 Å≦WI≦25 Å, preferably 7 Å≦WI≦25 Å, more preferably 7 Å≦WI≦20 Å, there is the effect of ensuring the improved electric resistance and the improved magnetic properties.

(6) Owing to the formation of oxidation preventive films, there is the effect of preventing the oxidation of the magnetic grains and also reducing the deterioration of the magnetic properties.

(7) Owing to the application of the foregoing granular magnetic thin film and multilayered magnetic film to magnetic components and electronic equipment, there is the effect of ensuring miniaturization of the magnetic components and electronic equipment.

The invention claimed is:

1. A multilayered magnetic film having a multilayered structure, comprising:
a plurality of magnetic layers;
a plurality of electrically insulating layers alternately laminated with the plurality of magnetic layers, wherein
each magnetic layer is composed of a granular film having magnetic grains enclosed by an insulating material, and
a thickness of the magnetic layer is less than a grain size of the magnetic grains to prevent growth of said magnetic grains using said electrically insulating layers.

2. A multilayered magnetic film having a multilayered structure, comprising:
a plurality of magnetic layers;
a plurality of insulating layers alternately laminated with the plurality of magnetic layers, wherein
each magnetic layer is composed of a granular film having magnetic grains enclosed by an insulating material, and
a thickness of the magnetic layer is less than a grain size of the magnetic grains to prevent growth of said magnetic grains using said insulating layers, characterized in that each of said magnetic layers is composed of CoFeAlO film, and each of said insulating layers is composed of $Al_2O_3$ film.

3. A multilayered magnetic film as set forth in claim 2, characterized in that the following relations are satisfied:

$$5 \text{ Å} < WM \leq 130 \text{ Å}, WI \leq 10 \text{ Å}$$

where WM represents the thickness of said magnetic layers, and WI represents the thickness of said insulating layers.

4. A multilayered magnetic film as set forth in claim 2, characterized in that the following relations are satisfied:

$$10 \text{ Å} \leq WM \leq 100 \text{ Å}, WI \leq 10 \text{ Å}$$

where WM represents the thickness of said magnetic layers, and WI represents the thickness of said insulating layers.

5. A multilayered magnetic film as set forth in claim 2, characterized in that the following relations are satisfied:

$$5 \text{ Å} \leq WM \leq 130 \text{ Å}, 5 \text{ Å} \leq WI \leq 8 \text{ Å}$$

where WM represents the thickness of said magnetic layers, and WI represents the thickness of said insulating layers.

6. A multilayered magnetic film as set forth in claim 2, characterized in that the following relations are satisfied:

$$10 \text{ Å} \leq WM \leq 100 \text{ Å}, 5 \text{ Å} \leq WI < 8 \text{ Å}$$

where WM represents the thickness of said magnetic layers, and WI represents the thickness of said insulating layers.

7. A multilayered magnetic film as set forth in claim 1, characterized in that each of said magnetic layers is composed of CoFeSiO film, and each of said electrically insulating layers is composed of $SiO_2$ film.

8. A multilayered magnetic film as set forth in claim 7, characterized in that the following relations are satisfied:

$$40 \text{ Å} \leq WM \leq 90 \text{ Å}, 5 \text{ Å} \leq WI \leq 25 \text{ Å}$$

where WM represents the thickness of said magnetic layers, and WI represents the thickness of said electrically insulating layers.

9. A multilayered magnetic film as set forth in claim 7, characterized in that the following relations are satisfied:

$$40 \text{ Å} \leq WM \leq 90 \text{ Å}, 7 \text{ Å} \leq WI \leq 25 \text{ Å}$$

where WM represents the thickness of said magnetic layers, and WI represents the thickness of said electrically insulating layers.

10. A multilayered magnetic film as set forth in claim 7, characterized in that the following relations are satisfied:

$$40 \text{ Å} \leq WM \leq 90 \text{ Å}, 7 \text{ Å} \leq WI \leq 20 \text{ Å}$$

where WM represents the thickness of said magnetic layers, and WI represents the thickness of said electrically insulating layers.

11. A multilayered magnetic film as set forth in claim 7, characterized in that the following relations are satisfied:

$$50 \text{ Å} \leq WM \leq 75 \text{ Å}, 5 \text{ Å} \leq WI \leq 25 \text{ Å}$$

where WM represents the thickness of the magnetic layers, and WI represents the thickness of the electrically insulating layers.

12. A multilayered magnetic film as set forth in claim 7, characterized in that the following relations are satisfied:

$$50 \text{ Å} \leq WM \leq 75 \text{ Å}, 7 \text{ Å} \leq WI \leq 25 \text{ Å}$$

where WM represents the thickness of the magnetic layers, and WI represents the thickness of the electrically insulating layers.

13. A multilayered magnetic film as set forth in claim 7, characterized in that the following relations are satisfied:

$$50 \text{ Å} \leq WM \leq 75 \text{ Å}, 7 \text{ Å} \leq WI \leq 20 \text{ Å}$$

where WM represents the thickness of the magnetic layers, and WI represents the thickness of the electrically insulating layers.

14. A magnetic component characterized in that at least one multilayered magnetic film stated in anyone of claims 1 to 13 is utilized.

15. A magnetic component as set forth in claim 14, characterized in that at least one oxidation preventive film is formed to prevent oxidation of the magnetic metal in said granular magnetic thin film or multilayered magnetic film.

16. An electronic equipment characterized by the use of at least one magnetic component stated in claim 14.

* * * * *